(12) United States Patent
Albert et al.

(10) Patent No.: US 6,392,785 B1
(45) Date of Patent: May 21, 2002

(54) NON-SPHERICAL CAVITY ELECTROPHORETIC DISPLAYS AND MATERIALS FOR MAKING THE SAME

(75) Inventors: Jonathan D. Albert; Barrett Comiskey, both of Cambridge, MA (US)

(73) Assignee: E Ink Corporation, Cambridge, MA (US)

( * ) Notice: Subject to any disclaimer, the term of this patent is extended or adjusted under 35 U.S.C. 154(b) by 0 days.

(21) Appl. No.: 09/493,635

(22) Filed: Jan. 28, 2000

Related U.S. Application Data

(62) Division of application No. 09/141,105, filed on Aug. 27, 1998, now Pat. No. 6,067,185.
(60) Provisional application No. 60/057,133, filed on Aug. 28, 1997, provisional application No. 60/057,716, filed on Aug. 28, 1997, provisional application No. 60/057,799, filed on Aug. 28, 1997, provisional application No. 60/057,163, filed on Aug. 28, 1997, provisional application No. 60/057,122, filed on Aug. 28, 1997, provisional application No. 60/057,798, filed on Aug. 28, 1997, provisional application No. 60/057,118, filed on Aug. 28, 1997, provisional application No. 60/059,358, filed on Sep. 19, 1997, provisional application No. 60/065,630, filed on Nov. 18, 1997, provisional application No. 60/065,605, filed on Nov. 18, 1997, provisional application No. 60/066,147, filed on Nov. 19, 1997, provisional application No. 60/066,245, filed on Nov. 20, 1997, provisional application No. 60/066,246, filed on Nov. 20, 1997, provisional application No. 60/066,115, filed on Nov. 21, 1997, provisional application No. 60/066,334, filed on Nov. 21, 1997, provisional application No. 60/066,418, filed on Nov. 24, 1997, provisional application No. 60/071,371, filed on Jan. 15, 1998, provisional application No. 60/070,940, filed on Jan. 9, 1998, provisional application No. 60/072,390, filed on Jan. 9, 1998, provisional application No. 60/070,939, filed on Jan. 9, 1998, provisional application No. 60/070,935, filed on Jan. 9, 1998, provisional application No. 60/074,454, filed on Feb. 12, 1998, provisional application No. 60/076,955, filed on Mar. 5, 1998, provisional application No. 60/076,959, filed on Mar. 5, 1998, provisional application No. 60/076,957, filed on Mar. 5, 1998, provisional application No. 60/076,978, filed on Mar. 5, 1998, provisional application No. 60/078,363, filed on Mar. 18, 1998, provisional application No. 60/083,252, filed on Apr. 27, 1998, provisional application No. 60/085,096, filed on May 12, 1998, and provisional application No. 60/093,689, filed on Jul. 22, 1998.

(51) Int. Cl.[7] .............................. G02B 26/00; G09G 3/34
(52) U.S. Cl. ........................ 359/296; 345/107; 204/606; 204/487; 264/4; 264/8; 427/213.3
(58) Field of Search ................................. 359/296, 452; 345/107, 108, 84; 264/4, 8, 4.1; 204/606, 450, 487; 427/213.3, 213.31

(56) References Cited

U.S. PATENT DOCUMENTS

| | | |
|---|---|---|
| 2,766,478 A | 10/1956 | Raley, Jr. et al. |
| 2,800,457 A | 7/1957 | Green et al. |

(List continued on next page.)

FOREIGN PATENT DOCUMENTS

| | | | |
|---|---|---|---|
| CH | 563 807 | 7/1975 | .............. B01J/2/04 |
| DE | 195 00 694 A1 | 8/1996 | |

OTHER PUBLICATIONS

Matsumoto, et al (Jun. 1982) "Generation of Mondispersed Concentric Two Phase Droplets for Encapsulation," ICLASS–'82, Reports & Proc. 2$^{nd}$ Intl. Conf. On Liquid Atomization & Spray Systems, pp. 63–67.

(List continued on next page.)

Primary Examiner—Loha Ben
(74) Attorney, Agent, or Firm—Testa, Hurwitz & Thibeault, LLP

(57) ABSTRACT

Disclosed herein are novel electrophoretic displays and materials useful in fabricating such displays. In particular, novel encapsulated displays are disclosed. Particles encapsulated therein are dispersed within a suspending, or electrophoretic, fluid. This fluid may be a mixture of two or more fluids or may be a single fluid. The displays may further comprise particles dispersed in a suspending fluid, wherein the particles contain a liquid. In either case, the suspending fluid may have a density or refractive index substantially matched to that of the particles dispersed therein. Finally, also disclosed herein are electro-osmotic displays. These displays comprise at least one capsule containing either a cellulosic or gel-like internal phase and a liquid phase, or containing two or more immiscible fluids. Application of electric fields to any of the electrophoretic displays described herein affects an optical property of the display.

19 Claims, 14 Drawing Sheets

U.S. PATENT DOCUMENTS

| | | |
|---|---|---|
| 3,036,388 A | 5/1962 | Tate |
| 3,384,488 A | 5/1968 | Tulagin et al. |
| 3,389,194 A | 6/1968 | Somerville |
| 3,406,363 A | 10/1968 | Tate |
| 3,423,489 A | 1/1969 | Arens et al. |
| 3,460,248 A | 8/1969 | Tate |
| 3,585,381 A | 6/1971 | Hodson et al. |
| 3,612,758 A | 10/1971 | Evans et al. |
| 3,617,374 A | 11/1971 | Bellbrook et al. .......... 117/212 |
| 3,668,106 A | 6/1972 | Ota |
| 3,670,323 A | 6/1972 | Sobel et al. |
| 3,756,693 A | 9/1973 | Ota |
| 3,767,392 A | 10/1973 | Ota |
| 3,772,013 A | 11/1973 | Wells |
| 3,792,308 A | 2/1974 | Ota |
| 3,806,893 A | 4/1974 | Ohnishi et al. |
| 3,850,627 A | 11/1974 | Wells et al. |
| 3,870,517 A | 3/1975 | Ota et al. |
| 3,892,568 A | 7/1975 | Ota |
| 3,909,116 A | 9/1975 | Kohashi |
| 3,922,255 A | 11/1975 | Koestler et al. |
| 4,001,140 A | 1/1977 | Foris et al. |
| 4,041,481 A | 8/1977 | Sato |
| 4,045,327 A | 8/1977 | Noma et al. |
| 4,062,009 A | 12/1977 | Raverdy et al. |
| 4,068,927 A | 1/1978 | White |
| 4,071,430 A | 1/1978 | Liebert |
| 4,087,376 A | 5/1978 | Foris et al. |
| 4,088,395 A | 5/1978 | Giglia |
| 4,093,534 A | 6/1978 | Carter et al. |
| 4,104,520 A | 8/1978 | Lewis et al. ............ 250/315 R |
| 4,123,206 A | 10/1978 | Dannelly ....................... 425/5 |
| 4,123,346 A | 10/1978 | Ploix |
| 4,126,528 A | 11/1978 | Chiang |
| 4,126,854 A | 11/1978 | Sheridon |
| 4,143,103 A | 3/1979 | Sheridon |
| 4,143,472 A | 3/1979 | Murata et al. |
| 4,147,932 A | 4/1979 | Lewis |
| 4,149,149 A | 4/1979 | Miki et al. |
| 4,166,800 A | 9/1979 | Fong |
| 4,196,437 A | 4/1980 | Hertz |
| 4,201,691 A | 5/1980 | Asher et al. |
| 4,203,106 A | 5/1980 | Dalisa et al. |
| 4,211,668 A | 7/1980 | Tate |
| 4,218,302 A | 8/1980 | Dalisa et al. |
| 4,231,641 A | 11/1980 | Randin |
| 4,261,653 A | 4/1981 | Goodrich |
| 4,272,596 A | 6/1981 | Harbour et al. |
| 4,273,672 A | 6/1981 | Vassiliades |
| 4,279,632 A | 7/1981 | Frosch |
| 4,285,801 A | 8/1981 | Chiang |
| 4,287,337 A | 9/1981 | Guglielmetti et al. .......... 544/6 |
| 4,298,448 A | 11/1981 | Müller et al. |
| 4,303,433 A | 12/1981 | Torobin ...................... 65/21.4 |
| 4,305,807 A | 12/1981 | Somlyody |
| 4,311,361 A | 1/1982 | Somlyody |
| 4,314,013 A | 2/1982 | Chang |
| 4,324,456 A | 4/1982 | Dalissa |
| 4,368,952 A | 1/1983 | Murata et al. |
| 4,390,403 A | 6/1983 | Batchelder |
| 4,418,346 A | 11/1983 | Batchelder |
| 4,419,383 A | 12/1983 | Lee |
| 4,438,160 A | 3/1984 | Ishikawa et al. |
| 4,439,507 A | 3/1984 | Pan et al. |
| 4,444,961 A | 4/1984 | Timm |
| 4,450,440 A | 5/1984 | White |
| 4,502,934 A | 3/1985 | Gazard et al. |
| 4,522,472 A | 6/1985 | Liebert et al. |
| 4,543,306 A | 9/1985 | Dubois et al. |
| 4,605,284 A | 8/1986 | Fergason |
| 4,620,916 A | 11/1986 | Zwemer et al. |
| 4,623,706 A | 11/1986 | Timm et al. |
| 4,643,528 A | 2/1987 | Bell, Jr. |
| 4,648,956 A | 3/1987 | Marshall et al. |
| 4,655,897 A | 4/1987 | DiSanto et al. |
| 4,666,673 A | 5/1987 | Timm |
| 4,707,080 A | 11/1987 | Fergason |
| 4,726,662 A | 2/1988 | Cromack |
| 4,732,830 A | 3/1988 | DiSanti et al. |
| 4,742,345 A | 5/1988 | DiSanto et al. |
| 4,746,917 A | 5/1988 | DiSanto et al. |
| 4,748,366 A | 5/1988 | Taylor |
| 4,772,102 A | 9/1988 | Fergason et al. |
| 4,824,208 A | 4/1989 | Fergason et al. |
| 4,832,458 A | 5/1989 | Fergason et al. |
| 4,833,464 A | 5/1989 | DiSanto et al. |
| 4,850,919 A | 7/1989 | DiSanto et al. |
| 4,888,140 A | 12/1989 | Schlameus et al. .......... 264/4.3 |
| 4,889,603 A | 12/1989 | DiSanto et al. |
| 4,891,245 A | 1/1990 | Micale |
| 4,909,959 A | 3/1990 | Lemaire et al. |
| 4,919,521 A | 4/1990 | Tada et al. |
| 4,931,019 A | 6/1990 | Park |
| 4,947,219 A | 8/1990 | Boehm |
| 4,960,351 A | 10/1990 | Kental et al. |
| 5,009,490 A | 4/1991 | Kouno et al. |
| 5,017,225 A | 5/1991 | Nakanishi et al. |
| 5,040,960 A | 8/1991 | Shoiya et al. ................ 264/4.1 |
| 5,041,824 A | 8/1991 | DiSanto et al. |
| 5,053,763 A | 10/1991 | DiSanto et al. |
| 5,057,363 A | 10/1991 | Nakanishi |
| 5,059,694 A | 10/1991 | Delabouglise et al. |
| 5,066,105 A | 11/1991 | Yoshimoto et al. |
| 5,066,559 A | 11/1991 | Elmasry et al. |
| 5,066,946 A | 11/1991 | DiSanto et al. |
| 5,070,326 A | 12/1991 | Yoshimoto et al. |
| 5,077,157 A | 12/1991 | DiSanto et al. |
| 5,082,351 A | 1/1992 | Fergason |
| 5,099,256 A | 3/1992 | Anderson |
| 5,105,185 A | 4/1992 | Nakanowatari et al. |
| 5,128,226 A | 7/1992 | Hung |
| 5,128,785 A | 7/1992 | Yoshimoto et al. |
| 5,132,049 A | 7/1992 | Garreau et al. |
| 5,138,472 A | 8/1992 | Jones et al. |
| 5,149,826 A | 9/1992 | Delabouglise et al. |
| 5,151,032 A | 9/1992 | Igawa |
| 5,174,882 A | 12/1992 | DiSanto et al. |
| 5,177,476 A | 1/1993 | DiSanto et al. |
| 5,185,226 A | 2/1993 | Grosso et al. |
| 5,187,609 A | 2/1993 | DiSanto et al. |
| 5,204,424 A | 4/1993 | Roncali et al. |
| 5,216,416 A | 6/1993 | DiSanto et al. |
| 5,216,530 A | 6/1993 | Pearlman et al. |
| 5,223,115 A | 6/1993 | DiSanto et al. |
| 5,223,823 A | 6/1993 | DiSanto et al. |
| 5,233,459 A | 8/1993 | Bozler et al. ................ 359/230 |
| 5,247,290 A | 9/1993 | DiSanto et al. |
| 5,250,932 A | 10/1993 | Yoshimoto et al. |
| 5,250,938 A | 10/1993 | DiSanto et al. |
| 5,254,981 A | 10/1993 | DiSanto et al. |
| 5,260,002 A | 11/1993 | Wang ......................... 264/4.1 |
| 5,262,098 A | 11/1993 | Crowley et al. |
| 5,266,098 A | 11/1993 | Chun et al. |
| 5,266,937 A | 11/1993 | DiSanto et al. |
| 5,268,448 A | 12/1993 | Buechner et al. |
| 5,270,843 A | 12/1993 | Wang |
| 5,272,238 A | 12/1993 | Garnier et al. |
| 5,276,113 A | 1/1994 | Hashiguchi et al. |
| 5,276,438 A | 1/1994 | DiSanto et al. |
| 5,279,511 A | 1/1994 | DiSanto et al. |
| 5,279,694 A | 1/1994 | DiSanto et al. |

| Patent No. | Date | Inventor | Class |
|---|---|---|---|
| 5,293,528 A | 3/1994 | DiSanto et al. | |
| 5,296,974 A | 3/1994 | Tada et al. | |
| 5,298,833 A | 3/1994 | Hou | |
| 5,302,235 A | 4/1994 | DiSanto et al. | |
| 5,303,073 A | 4/1994 | Shirota et al. | |
| 5,304,439 A | 4/1994 | DiSanto et al. | |
| 5,315,312 A | 5/1994 | DiSanto et al. | |
| 5,326,484 A | 7/1994 | Nakashima et al. | |
| 5,344,594 A | 9/1994 | Sheridon | |
| 5,357,355 A | 10/1994 | Arai | 359/39 |
| 5,359,346 A | 10/1994 | DiSanto et al. | |
| 5,360,689 A | 11/1994 | Hou et al. | |
| 5,380,362 A | 1/1995 | Schubert | |
| 5,383,008 A | 1/1995 | Sheridon | |
| 5,389,945 A | 2/1995 | Sheridon | |
| 5,402,145 A | 3/1995 | DiSanto et al. | |
| 5,403,518 A | 4/1995 | Schubert | |
| 5,403,772 A | 4/1995 | Zhang et al. | 437/101 |
| 5,411,398 A | 5/1995 | Nakanishi et al. | |
| 5,411,656 A | 5/1995 | Schubert | |
| 5,421,926 A | 6/1995 | Yukinobu et al. | |
| 5,463,492 A | 10/1995 | Check | |
| 5,467,107 A | 11/1995 | DiSanto et al. | |
| 5,498,674 A | 3/1996 | Hou et al. | |
| 5,508,068 A | 4/1996 | Nakano | |
| 5,512,162 A | 4/1996 | Sachs et al. | |
| 5,528,399 A | 6/1996 | Izumi et al. | 359/72 |
| 5,543,177 A | 8/1996 | Morrison et al. | |
| 5,543,219 A | 8/1996 | Elwakil | |
| 5,552,679 A | 9/1996 | Murasko | |
| 5,556,583 A | 9/1996 | Tashiro | |
| 5,561,443 A | 10/1996 | DiSanto et al. | |
| 5,565,885 A | 10/1996 | Tamanoi | |
| 5,569,610 A | 10/1996 | Zhang et al. | 437/21 |
| 5,573,711 A | 11/1996 | Hou et al. | |
| 5,582,700 A | 12/1996 | Bryning et al. | |
| 5,583,675 A | 12/1996 | Yamada et al. | |
| 5,597,889 A | 1/1997 | Takimoto et al. | |
| 5,604,027 A | 2/1997 | Sheridon | |
| 5,604,070 A | 2/1997 | Rao et al. | |
| 5,610,455 A | 3/1997 | Allen et al. | |
| 5,614,340 A | 3/1997 | Bugner et al. | |
| 5,627,561 A | 5/1997 | Laspina et al. | |
| 5,635,317 A | 6/1997 | Taniguchi et al. | |
| 5,638,103 A | 6/1997 | Obata et al. | |
| 5,639,914 A | 6/1997 | Tomiyama et al. | |
| 5,643,506 A | 7/1997 | Rourke | |
| 5,643,673 A | 7/1997 | Hou | |
| 5,650,199 A | 7/1997 | Chang et al. | 427/33 |
| 5,650,247 A | 7/1997 | Taniguchi et al. | |
| 5,650,872 A | 7/1997 | Saxe et al. | |
| 5,654,367 A | 8/1997 | Takimoto et al. | |
| 5,663,224 A | 9/1997 | Emmons et al. | |
| 5,672,381 A | 9/1997 | Rajan | |
| 5,673,148 A | 9/1997 | Morris et al. | |
| 5,676,884 A | 10/1997 | Tiers et al. | |
| 5,688,584 A | 11/1997 | Casson et al. | 428/209 |
| 5,691,098 A | 11/1997 | Busman et al. | |
| 5,693,442 A | 12/1997 | Weiss et al. | |
| 5,694,224 A | 12/1997 | Tai | |
| 5,707,738 A | 1/1998 | Hou | |
| 5,707,747 A | 1/1998 | Tomiyama et al. | |
| 5,708,525 A | 1/1998 | Sheridon | |
| 5,709,976 A | 1/1998 | Malhotra | |
| 5,714,270 A | 2/1998 | Malhotra et al. | 428/537.5 |
| 5,715,511 A | 2/1998 | Aslam et al. | 399/320 |
| 5,716,550 A | 2/1998 | Gardner et al. | 252/500 |
| 5,717,283 A | 2/1998 | Biegelsen et al. | 313/483 |
| 5,717,514 A | 2/1998 | Sheridon | 359/296 |
| 5,717,515 A | 2/1998 | Sheridon | 359/296 |
| 5,725,935 A | 3/1998 | Rajan | 428/195 |
| 5,729,632 A | 3/1998 | Tai | 382/237 |
| 5,737,115 A | 4/1998 | Mackinlay et al. | 359/296 |
| 5,739,801 A | 4/1998 | Sheridon | 345/84 |
| 5,745,094 A | 4/1998 | Gordon, II et al. | 345/107 |
| 5,751,268 A | 5/1998 | Sheridon | 345/107 |
| 5,753,763 A | 5/1998 | Rao et al. | 525/276 |
| 5,754,332 A | 5/1998 | Crowley | 359/296 |
| 5,759,671 A | 6/1998 | Tanaka et al. | 428/166 |
| 5,760,761 A | 6/1998 | Sheridon | 345/107 |
| 5,767,826 A | 6/1998 | Sheridon et al. | 345/84 |
| 5,777,782 A | 7/1998 | Sheridon | 359/296 |
| 5,783,614 A | 7/1998 | Chen et al. | 523/205 |
| 5,808,783 A | 9/1998 | Crowley | 359/296 |
| 5,821,137 A | 10/1998 | Wakai et al. | 438/163 |
| 5,825,529 A | 10/1998 | Crowley | 359/296 |
| 5,828,432 A | 10/1998 | Shashidhar et al. | 349/139 |
| 5,843,259 A | 12/1998 | Narang et al. | 156/151 |
| 5,872,552 A | 2/1999 | Gordon, II et al. | 345/107 |
| 5,894,367 A | 4/1999 | Sheridon | 359/623 |
| 5,900,858 A | 5/1999 | Richley | 345/107 |
| 5,914,806 A | 6/1999 | Gordon, II et al. | 359/296 |
| 5,930,026 A | 7/1999 | Jacobson et al. | 359/296 |
| 5,961,804 A | 10/1999 | Jacobson et al. | 204/606 |
| 6,014,247 A | 1/2000 | Winter et al. | 359/296 |
| 6,017,584 A | 1/2000 | Albert et al. | 427/213.3 |
| 6,025,896 A | 2/2000 | Hattori et al. | 349/86 |
| 6,045,955 A | 4/2000 | Vincent | 430/45 |
| 6,055,091 A * | 4/2000 | Sheridon et al. | 359/296 |
| 6,064,784 A | 5/2000 | Whitehead et al. | 385/18 |
| 6,113,810 A | 9/2000 | Hou et al. | 252/572 |
| 6,117,294 A | 9/2000 | Rasmussen | 204/485 |
| 6,117,368 A | 9/2000 | Hou | 252/572 |
| 6,118,426 A | 9/2000 | Albert et al. | 345/107 |
| 6,144,361 A | 11/2000 | Gordon, II et al. | 345/107 |
| 6,153,075 A | 11/2000 | Nemelka | 204/485 |

FOREIGN PATENT DOCUMENTS

| | | | |
|---|---|---|---|
| EP | 0 087 193 A2 | 8/1983 | G02F/1/19 |
| EP | 0 186 710 A1 | 7/1986 | |
| EP | 0 240 063 B1 | 10/1987 | |
| EP | 0 268 877 A3 | 6/1988 | |
| EP | 0 268 877 A2 | 6/1988 | |
| EP | 0 281 204 A2 | 9/1988 | |
| EP | 0 323 656 B1 | 7/1989 | |
| EP | 0 325 013 A1 | 7/1989 | |
| EP | 0 325 013 B1 | 7/1989 | |
| EP | 0 361 420 A2 | 4/1990 | |
| EP | 0 375 005 B1 | 6/1990 | |
| EP | 0 396 937 A2 | 11/1990 | |
| EP | 0 404 545 A2 | 12/1990 | |
| EP | 0 408 105 B1 | 1/1991 | |
| EP | 0 442 123 A1 | 8/1991 | |
| EP | 0 443 571 A2 | 8/1991 | |
| EP | 0 525 852 A1 | 2/1993 | |
| EP | 0 525 852 B1 | 2/1993 | |
| EP | 0 540 281 A2 | 5/1993 | |
| EP | 0 323 656 B1 | 7/1993 | |
| EP | 0 709 713 A2 | 5/1996 | G02F/1/07 |
| EP | 0 721 176 A3 | 7/1996 | |
| EP | 0 721 176 A2 | 7/1996 | |
| EP | 0 600 878 B1 | 2/1997 | G02F/1/167 |
| EP | 0 778 083 A1 | 6/1997 | B01J/13/04 |
| EP | 0 962 808 A2 | 12/1999 | G02F/1/167 |
| EP | 0 685 101 B1 | 4/2000 | G09G/3/34 |
| EP | 0 708 798 B1 | 4/2000 | C08K/13/06 |
| EP | 1 024 540 A2 | 8/2000 | H01L/41/08 |
| GB | 1 314 906 | 4/1973 | |
| GB | 1 465 701 | 3/1977 | |
| GB | 2 044 508 A | 10/1980 | |
| GB | 2 292 119 A | 2/1996 | |
| GB | 2 306 229 A | 4/1997 | |

| | | | | | | | | |
|---|---|---|---|---|---|---|---|---|
| GB | 2 324 273 A | 10/1998 | | JP | | 00 322005 | 11/2000 | ............. G09F/9/37 |
| JP | 53-73098 | 6/1978 | | JP | | 00 322006 | 11/2000 | ............. G09F/9/37 |
| JP | 54111368 | 8/1979 | | JP | | 00 322007 | 11/2000 | ............. G09F/9/37 |
| JP | 55096922 | 7/1980 | | JP | | 00 352946 | 12/2000 | ............. G09F/9/37 |
| JP | 59098227 | 6/1984 | | JP | | 06 239896 | 5/2001 | ............. G02F/1/01 |
| JP | 60189731 | 9/1985 | | WO | WO 82/02961 | 9/1982 | | |
| JP | 60 197565 | 10/1985 | ........... B65H/37/04 | WO | WO 92/17873 | 10/1992 | | |
| JP | 62058222 | 3/1987 | | WO | WO 94/24236 | 10/1994 | | |
| JP | 62231930 | 10/1987 | | WO | WO 95/02636 | 1/1995 | | |
| JP | 62269124 | 11/1987 | | WO | WO 95/05622 | 2/1995 | | |
| JP | 62299824 | 12/1987 | | WO | WO 95/15363 | 6/1995 | | |
| JP | 01086116 | 3/1989 | | WO | WO 95/19227 | 7/1995 | | |
| JP | 01086117 A | 3/1989 | | WO | WO 95/27924 | 10/1995 | | |
| JP | 01086118 A | 3/1989 | | WO | WO 95/33085 | 12/1995 | | |
| JP | 64 86116 | 3/1989 | | WO | WO 97/01165 | 1/1997 | | |
| JP | 01142537 A | 6/1989 | | WO | WO 97/01166 | 1/1997 | | |
| JP | 01177517 | 7/1989 | | WO | WO 97/04398 | 2/1997 | | |
| JP | 01248182 A | 10/1989 | | WO | WO 97/24715 | 7/1997 | | |
| JP | 01267525 | 10/1989 | | WO | WO 97/24907 | 7/1997 | | |
| JP | 02223934 A | 9/1990 | | WO | WO 98/03896 | 1/1998 | | |
| JP | 02223935 A | 9/1990 | | WO | WO 98/19208 | 5/1998 | | |
| JP | 02223936 A | 9/1990 | | WO | WO 98/41898 | 9/1998 | | |
| JP | 02284124 A | 11/1990 | | WO | WO 98/41899 | 9/1998 | | |
| JP | 02284125 A | 11/1990 | | WO | WO 98/58383 | 12/1998 | | |
| JP | 30 53224 | 3/1991 | ............ G02F/1/167 | WO | WO 99/03626 | 1/1999 | ............. B22F/9/08 | |
| JP | 30 91772 | 4/1991 | ............ G02F/1/19 | WO | WO 99/10767 | 3/1999 | | |
| JP | 30 96925 | 4/1991 | ............ G02F/1/19 | WO | WO 99/10768 | 3/1999 | | |
| JP | 04 307512 | 10/1992 | ............ G02B/2/728 | WO | WO 99/10769 | 3/1999 | | |
| JP | 43 07523 | 10/1992 | ............ G02F/1/167 | WO | WO 99/12170 | 3/1999 | | |
| JP | 04 345133 | 12/1992 | ............ G02F/1/167 | WO | WO 99/24715 | 5/1999 | | |
| JP | 5-61421 | 3/1993 | | WO | WO 99/26419 | 5/1999 | | |
| JP | 05165064 A | 6/1993 | | WO | WO 99/47970 | 9/1999 | | |
| JP | 05173194 A | 7/1993 | | WO | WO 99/53371 | 10/1999 | | |
| JP | 05307197 A | 11/1993 | | WO | WO 99/56171 | 11/1999 | | |
| JP | 6089081 | 3/1994 | | WO | WO 99/65011 | 12/1999 | | |
| JP | 6-202168 | 7/1994 | | WO | WO 99/65012 | 12/1999 | | |
| JP | 07 036020 | 2/1995 | ......... G02F/11/333 | WO | WO 00/10048 | 2/2000 | | |
| JP | 2551783 | 8/1996 | | WO | WO 00/75720 A2 | 12/2000 | ............. G02F/1/19 | |
| JP | 08234176 | 9/1996 | | WO | WO 00/77570 A1 | 12/2000 | ........... G02F/1/167 | |
| JP | 9-6277 | 1/1997 | | WO | WO 00/77571 A1 | 12/2000 | ........... G02F/1/167 | |
| JP | 9031453 A | 2/1997 | | WO | WO 01/11424 | 2/2001 | ........... G02F/1/167 | |
| JP | 9-185087 | 7/1997 | | WO | WO 01/18090 A1 | 3/2001 | ........... C08G/61/12 | |
| JP | 9-211499 | 8/1997 | | | | | | |
| JP | 09230391 | 9/1997 | | | | | | |
| JP | 10-48673 | 2/1998 | | | | | | |
| JP | 10072571 A | 3/1998 | | | | | | |
| JP | 10-149118 A | 6/1998 | | | | | | |
| JP | 10-161161 | 6/1998 | | | | | | |
| JP | 11212499 | 8/1999 | | | | | | |
| JP | 11219135 | 8/1999 | | | | | | |
| JP | 11237851 A | 8/1999 | | | | | | |
| JP | 11 352526 | 12/1999 | ............ G02F/1/19 | | | | | |
| JP | 00 066247 | 3/2000 | ........... G02F/1/167 | | | | | |
| JP | 00 066248 | 3/2000 | ........... G02F/1/167 | | | | | |
| JP | 00 066249 | 3/2000 | ........... G02F/1/167 | | | | | |
| JP | 00 089260 | 3/2000 | ........... G02F/1/167 | | | | | |
| JP | 00 127478 | 5/2000 | ........... B41J/2/385 | | | | | |
| JP | 00 137250 | 5/2000 | ........... G02F/1/167 | | | | | |
| JP | 00 140582 | 5/2000 | ........... B01D/5/702 | | | | | |
| JP | 00 171839 | 6/2000 | ........... G02F/1/167 | | | | | |
| JP | 00 194020 | 7/2000 | ........... G02F/1/167 | | | | | |
| JP | 00 194021 | 7/2000 | ........... G02F/1/167 | | | | | |
| JP | 00 206574 | 7/2000 | ........... G02F/1/167 | | | | | |
| JP | 00 227612 | 8/2000 | ........... G02F/1/167 | | | | | |
| JP | 00 258805 | 9/2000 | ........... G02F/1/167 | | | | | |
| JP | 00 259102 | 9/2000 | ............ G09F/9/37 | | | | | |
| JP | 00 285219 | 10/2000 | ......... G06K/19/077 | | | | | |
| JP | 00 321605 | 11/2000 | ........... G02F/1/167 | | | | | |
| JP | 00 322002 | 11/2000 | ........... G02F/9/37 | | | | | |
| JP | 00 322003 | 11/2000 | ........... G09F/9/37 | | | | | |
| JP | 00 322004 | 11/2000 | ........... G09F/9/37 | | | | | |

OTHER PUBLICATIONS

Franjione, et al, (Jun., 1995) "The Art and Science of Microencapsulation," *Technology Today*.

Matsumot, et al, (1989) "A Production Process for Uniform–Size Polymer Particles," *Journal of Chemical Engineering of Japan*, vol. 22, No. 6, pp. 691–694.

Esen, et al, (1997) "Synthesis of Sperical Microcapsules by Photopolymerization in Aerosols," *Colloid & Polymer Science*, vol. 275, No. 2, pp. 131–137.

Matsumoto, et al, (1986) "Production of Monodispersed Capsules," *Journal of Microencapsulation*, vol. 3, No. 1, pp. 25–31.

Matsumoto, et al (Jun. 1982) "Generation of Monodispersed Concentric Two Phase Droplets for Encapsulation," *ICLASS–'82, Reports & Proc. 2$^{nd}$ Intl. Conf. On Liquid Atomization & Spray Systems*, pp. 63–67.

Franjione, et al, (Jun., 1995) "The Art and Science of Microencapsulation," *Technology Today*.

Matsumoto, et al, (1989) "A Production Process for Uniform–Size Polymer Particles," *Journal of Chemical Engineering of Japan*, vol. 22, No. 6, pp. 691–694.

Esen, et al, (1977) "Synthesis of Spherical Microcapsules by Photopolymerization in Aerosols," *Colloid & Polymer Science*, vol. 275, No. 2, pp. 131–137.

Matusmoto, et al, (1986) "Production of Monodispersed Capsules," *Journal of Microencapsulation,* vol. 3, No. 1, pp. 25–31.

Ackerman, (Dec. 1997) "E Ink of Cambridge Gets Start–Up Funding".

Antia, (1999) "Switchable Reflections Make Electronic Ink," *Science,,* vol. 256, No. 658.

Ballinger, (Mar. 1973) "Magnetic Recording Paper is Erasable," *Electronics,* vol. 46, No. 5, pp. 73–76.

Beilin et al., (1986) "8.5: 2000–Character Electrophoretic Display," *SID 86 Digest,,* pp. 136–140.

Blazo, (1982) "10.1/9:00 A.M.: High Resolution Electrophoretic Display with Photoconductor Addressing," *SID 82 Digest,* pp. 92–93.

Bohnke et al., (Dec. 1991) "Polymer–Based Solid Electrochronic Cell for Matrix–Addressable Display Devices," *J. Electrochem Soc.,* vol. 138, No. 12, pp. 3612–3617.

Brenn et al., (1996), "Monodisperse Sprays for Various Purposes—Their Production and Characteristics", *Part. Syst. Charact.,* vol. 13, pp. 179–185.

Brenn et al. (1997), "A New Apparatus for the Production of Monodisperse Sprays at High Flow Rates", Chemical Engineering Science, vol. 52, No. 2, pp. 237–244.

Bryce, (Sep. 1988) "Seeing Through Synthetic Metals," *Nature,* vol. 335, No. 1, pp. 12–13.

Chiang et al., (1979), "7.5/4:05 P.M.: A Stylus Writable Electrophoretic Display Device," *SID 79 Digest,* pp. 44–45.

Chiang et al., (1980) "11.5/4:10 P.M.: A High Speed Electrophoretic Matrix Display," *SID 80 Digest,* pp. 114–115.

Chiang, (1977) "Conduction Mechanism of Charge Control Agents Used in Electrophoretic Display Devices," *Proceeding of the S.I.D.,* vol. 18, Nos. 3 & 4, pp. 275–282.

Comiskey et al., (Jul. 1998) "An Electrophoretic Ink for All–Printed Reflective Electronic Displays," *Nature,* vol. 394, pp. 253–255.

Comiskey et al., (1997) "7.4L: Late–News Paper: Electrophoretic Ink: A Printable Display Material," *SID 97 Digest,* pp. 75–76.

Croucher et al., (1981) "Electrophoretic Display: Materials as Related to Performance," *Photographic Science and Engineering,* vol. 25, No. 2, :pp. 80–86.

Dabbousi et al., (1995) "Electroluminescence from CdSe Quantum–dot/Polymer Composites," *Applied Physics Letters,* vol. 66, No. 11, pp. 1316–1318.

Dalisa, (Jul. 1977) "Electrophoretic Display Technology," *Transactions on Electron Devices,* vol. 24, No. 7, pp. 827–834.

Drzaic, P. et al. (1998), "44.3L: A Printed and Rollable Bistable Electronic Display", *SID 98 Digest* pp. 1–3.

"E Ink debuts in J.C. Penney Stores", *Boston Herald,* May 23, 1999, p. 27.

Egashira et al., (1987) "A Solid Electrochromic Cell Consisting of LU–Diphthalocyanine and Lead Fluoride," *Proceedings of the SID,* vol. 28, No. 3, pp. 227–232.

"Electronic Book is a Whole Library," *Sunday Times Newspaper,* Feb. 1996.

"Electronic Ink Sign Debuts at JCPenney," *Boston Globe,* May 1999.

Fitzhenry, (Oct. 1979) "Optical Effects of Adsorption of Dyes on Pigment Used in Electrophoretic Image Displays," *Applied Optics,* vol. 18, No. 19, pp. 3332–3337.

Fitzhenry, (1981) "Optical Properties of Electrophoretic Image Displays," *Proceedings of the SID,* vol. 22, No. 4, pp. 300–309.

Flaherty, (May 1999) "What Did Disappearing Ink Grow Up to Be? Electronic Ink," *The New York Times.*

Goodman, (1976) "Passive Liquid Displays: Liquid Crystals, Electrophoretics, and Electrochromics," *Proceeding of the SID,* vol. 17, No. 1, pp. 30–38.

Guernsey, (Jun. 1999) "Beyond Neon: Electronic Ink," *New York Times,* p. B11.

Gutcho, (1976) "Additional Uses for Encapsulated Products," *Microencapsules and Microencapsulation Techniques,* pp. 278–343.

Gutcho, (1976) "Capsule Wall Treatment," *Microcapsules and Microencapsulation Techniques,* pp. 156–177.

Gutcho, (1976) "Microencapsulation with Synthetic Polymeric Film Formers," *Microcapsules and Microencapsulation Techniques,* pp. 65–130.

Gutcho, (1976) "Pigments and Paints," *Microcapsules and Microencapsulation Techniques,* pp. 178–193.

Hatano et al., (1996) "18.3: Bistable Paper–White Display Device Using Cholesteric Liquid Crystals," *SID 96 Digest,* pp. 269–272.

Heinzel, J. and C.H. Herz, (1985) "Ink–Jet Printing", *Advances in Electronics and Electron Physics,* vol. 65, pp. 91–171.

Howe, (1996) "MIT Book Would Bind Computer "Ink" to Paper," *Boston Globe,* pp. 31 & 35.

Huang et al., (1997) "Photoluminescence and Electroluminescence of ZnS:Cu Nanocrystals in Polymeric Networks," *Applied Physics Letters,* vol. 70, No. 18, pp. 2335–2337.

Ji et al., "P–50: Polymer Walls in Higher–Polymer–Content Bistable Reflective Cholesteric Displays," *SID 96 Digest,* pp. 611–613.

Jin et al., (1992) "Optically Transparent, Electrically Conductive Composite Medium," *Science,* pp. 446–448.

Lee, (1977) "Fabrication of Magnetic Particles Display," *Proceeding of the SID,* vol. 18, Nos. 3,4 pp. 283–288.

Lewis, (1977) "Gravitational, Inter–Particle and Particle–Electrode Forces in the Electrophoretic Display," *Proceeding of the SID,* vol. 18, Nos. 3 & 4 pp. 235–242.

Matsumoto et al. (1986) "Production of Monodispersed Capsules" *J. Microencapsulation,* vol. 3, No. 1 pp. 25–31.

Matsumoto, Shiro and Hidehiko Kobayashi, (Jun. 20–24, 1982) "Generation of Monodispersed Concentric Two Phase Droplets for Encapsulation" *ICLASS–82 Reports & Proc. $2^{nd}$ Int. Conf. on Liquid Atomization & Spray Systems,* pp. 63–66.

Mürau et al., (1979) "7.6/4:40 P.M.: An Electrophoretic RadioGraphic Device," *SID 79 Digest,* pp. 46–47.

Mürau et al., (Sep. 1978) "The Understanding and Elimination of Some Suspension Instabilities in a Electrophoretic Display," *J. Appl. Phys.,* vol. 49, No. 9 pp. 4820–4829.

Nakamura et al., (May 1998) "Development of Electrophoretic Display Using Microencapsulated Suspension," *1998 ISD International Symposium Digest of Technical Papers, vol. 29, Proceedings of SID '98 International Symposium,* pp. 1014–1017.

Negroponte et al., (Jan. 1997) "Surfaces and Displays," *Wired,* p. 212.

Ota et al., (1977) "Developments in Electrophoretic Displays," *Proceedings of the SID,* vol. 18 Nos. 3 & 4, pp. 243–254.

Ota et al., (1975) "Electrophoretic Display Devices," *Laser 75 Optoelectronics Conference Proceedings,* pp. 145–148.

Ota et al., (Jul. 1973) "Electrophoretic Image Display," *Proceedings of the IEEE,* pp. 832–836.

Pankove, (Mar. 1962) "Color Reflection Types Display Panel," *RCA Technical Notes,* No. 535, (2 sheets).

Pansu et al. (1983), "Thin Colloidal Crystals: A Series of Structural Transitions," *J. Physique,* vol. 44 pp. 531–536.

Pansu et al. (1984), "Structures of Thin Layers of Hard Spheres: High Pressure Limit," *J. Physique,* vol. 45 pp. 331–339.

Pearlstein, (1976) "Electroless Plating," *Modern Electroplating,* Lowenheim, ed., 3$^{rd}$ Edition, John Wiley & Sons, Inc., New York, pp. 710–747.

Peiranski et al. (1983), "Thin Colloidal Crystals," *Physical Review Letters,* vol. 50 No. 12 pp. 900–903.

Peterson, (Jun. 1998) "Rethinking Ink Printing the Pages of an Electronic Book," *Science News,* vol. 153, pp. 396–397.

Platt, (May 1997) "Digital Ink," *Wired,* pp. 162, 165, 208–210.

Ridley et al., (Oct. 22, 1999) "All–Inorganic Field Effect Transistors Fabricated by Printing", *Science,* vol. 286, pp. 746–748.

Saitoh et al., (1982) "A Newly Developed Electrical Twisting Ball Display," *Proceedings of the SID,* vol. 23, No. 4, pp. 249–253.

Sankus, (May/Jun. 1979) "Electrophoretic Display Cell," *Xerox Disclosure Journal,* vol. 4, No. 3, p. 309.

Sheridon et al., (1977) "The Gyricon—A Twisting Ball Display," *Proceeding of the SID,* vol. 18, Nos. 3 & 4, pp. 289–293.

Shiffman et al., (1984) "An Electrophoretic Display with Internal NMOS Address Logic and Display Drivers," *Proceedings of the SID,* vol. 25, No. 2, pp. 105–115.

Shimoda et al., (1999) "Multicolor Pixel Patterning of Light–Emitting Polymers by Ink–Jet Printing," *SID 99 Digest,* pp. 376–379.

Shiwa et al., (1988) "5.6: Electrophoretic Display Method Using Ionographic Technology," *SID 88 Digest,* pp. 61–62.

Singer et al., (1977) "An X–Y Addressable Electrophoretic Display," *Proceeding of the SID,* vol. 18, Nos. 3 & 4, pp. 255–266.

Vandegaer et al., "Microencapsulation: Processes and Applications," *American Chemical Society Symposium,* Chicago, IL, 1973, pp. v–x, 1–180 (published by Plenum Press, New York, 1974).

Van Winkle et al. (1986), "Layering Transitions in Colloidal Crystals as Observed by Diffraction and Direct–Lattice Imaging", *Physical Review,* vol. 34 pp. 562–573.

Vance, (1977) "Optical Characteristics of Electrophoretic Displays," *Proceeding of the SID,* vol. 18, Nos. 3 & 4, pp. 267–274.

Vaz et al., (Jun. 1989) "Dual Frequency Addressing of Polymer–Dispersed Liquid–Crystal Films," *J. Appl. Phys.,* vol. 65, No. 12, pp. 5043–5050.

White, (1981) "An Electrophoretic Bar Graph Display," *Proceedings of the SID,* vol. 22, No. 3, pp. 173–180.

Yamaguchi et al., (1991) "Equivalent Circuit of Ion Projection–Driven Electrophoretic Display," *IEICE Transactions,* vol. 74, No. 12, pp. 4152–4156.

Yang et al., (Nov. 1994) "A New Architecture for Polymer Transistors," *Nature,* vol. 372, pp. 344–346.

Zollinger, (1991) "Structures of Simple Di–and Triarylmethine Dyes," *Color Chemistry,* pp. 71–75.

Zurer, (Jul. 1998) "Digital Ink Brings Electronic Books Closer," *Chemical,* pp. 12–13.

Amundson, K. et al, "Flexible, Active–Matrix Display Constructed Using a Microencapsulated Electrophoretic Material and an Organic–Semicondutor–Based Backplane", SID 2001 Digest, pp 160–63.

Berst, J., Anchor Desk, "E–Paper Here Sooner Than You Think", Nov. 20, 2000, http:/www.zdnet.com/filters/printer-friendly/0,6061,2656348–10,00.html.

Business Wire, "EInk and Lucent Technologies Demonstrate World's First Flexible Electronic Ink Display with Plastic Transistors", http://www.zdnet.com/cgi–bin/printme.fcgi?t=zdii, Nov. 20, 2000.

Chen, Y. et al, "A Conformable Electronic Ink Display Using a Foil–Based a–Si TFT Array", SID 2001 Digest, pp 157–159.

"Digital Ink Meets Electronic Paper", *The Economist,* Dec. 9, 2000.

Kazlas, P. et al, "SVGA Microencapsulated Electrophoretic Active Matrix Display for Information Appliances", SID 2001 Digest, pp 152–155.

Luckham, P.F. et al., "The Controlled Flocculation of Particulate Dispersion Using Small Particles of Opposite Charge. II. Investigation of Floc Structure Using a Freeze–Fracture Technique", Colloids and Surfaces, 6 (1983), pp. 83–95.

Luckham, P.F. et al., "The Controlled Flocculation of Particulate Dispersion Using Small Particles of Opposite Charge. III. Investigation of Floc Structure Using a Freeze–Fracture Technique", Colloids and Surfaces, 6 (1983), pp. 101–118.

Nakabu, S. et al, "The Development of Super–High Aperture Ratio with Low Electrically Resistive Material for High–Resolution TFT–LCDs", SID 1999 Digest, pp. 732–735.

Sano, Masahito, "Block Copolymer Epitaxy", Advanced Materials, 1997, vol. 9, No. 6, pp 509–511.

Soule, C.A., "E Ink Pens Deal with Lucent", Mass. High Technology, Jul. 10, 2000, 3 pgs.

Toyama, J., "An Electrophoretic Matrix Display with External Logic and Driver Directly Assembled to the Panel", SID 1994 Digest, pp. 588–590.

Vincent, B. etc., "Adsorption of Small, Positive Particles onto Large, Negative Particles in the Presence of Polymer", J.C.S. Faraday 1, 1980, 76, pp. 665–673.

Wessling, B., "Polymers to Organic Metals", Chemical Innovation, Jan. 2001, pp 35–40.

* cited by examiner

NON-SPHERICAL CAVITY ELECTROPHORETIC DISPLAYS AND MATERIALS FOR MAKING THE SAME

CROSS-REFERENCE TO RELATED APPLICATIONS

The present application hereby incorporates by reference herein U.S. Pat. No. 08/504,896, filed Jul. 20, 1995, now U.S. Pat. No. 6,124,851, U.S. Pat. No. 08/983,404, filed Jul. 19, 1996, and U.S. Pat. No. 08/935,800, filed Sep. 23, 1997, now U.S. Pat. No. 6,120,588. The present application a is a divisional of, and incorporates by reference, U.S. Pat. No. 09/141,105, filed Aug. 27, 1998, now U.S. Pat. No. 6,067, 185, which, claims priority to U.S. Pat. No. 60/057,133, filed Aug. 28, 1997, U.S. Pat. No. 60/057,716, filed Aug. 28, 1997, U.S. Pat. No. 60/057,799, filed Aug. 28, 1997, U.S. Pat. No. 60/057,163, filed Aug. 28, 1997, U.S. Pat. No. 60/057,122, filed Aug. 28, 1997, U.S. Pat. No. 60/057,798, filed Aug. 28, 1997, U.S. Pat. No. 60/057,118, filed Aug. 28, 1997, U.S. Pat. No. 60/059,358, filed Sep. 19, 1997, U.S. Pat. No. 60/065,630, filed Nov. 18, 1997, U.S. Pat. No. 60/065,605, filed Nov. 18, 1997, U.S. Pat. No. 60/066,147, filed Nov. 19, 1997, U.S. Pat. No. 60/066,245, filed Nov. 20, 1997, U.S. Pat. No. 60/066,246, filed Nov. 20, 1997, U.S. Pat. No. 60/066,115, filed Nov. 21, 1997, U.S. Pat. No. 60/066,334, filed Nov. 21, 1997, U.S. Pat. No. 60/066,418, filed Nov. 24, 1997, U.S. Pat. No. 60/071,371, filed Jan. 15, 1998, U.S. Pat. No. 60/070,940, filed Jan. 9, 1998, U.S. Pat. No. 60/072,390, filed Jan. 9, 1998, U.S. Pat. No. 60/070,939, filed Jan. 9, 1998, U.S. Pat. No. 60/070,935, filed Jan. 9, 1998, U.S. Pat. No. 60/074,454, filed Feb. 12, 1998, U.S. Pat. No. 60/076,955, filed Mar. 5, 1998, U.S. Pat. No. 60/076,959, filed Mar. 5, 1998, U.S. Pat. No. 60/076,957, filed Mar. 5, 1998, U.S. Pat. No. 60/076,978, filed Mar. 5, 1998, U.S. Pat. No. 60/078,363, filed Mar. 18, 1998, U.S. Pat. No. 60/083,252, filed Apr. 27, 1998, U.S. Pat. No. 60/085,096, filed May 12, 1998, and U.S. Pat. No. 60/093, 689, filed Jul. 22, 1998, the entire disclosures of which are hereby incorporated by reference herein.

FIELD OF THE INVENTION

The present invention relates to electrophoretic displays, particularly encapsulated electrophoretic displays, and to materials useful in fabricating such displays.

BACKGROUND OF THE INVENTION

Electrophoretic displays have been the subject of intense research and development for a number of years. Electrophoretic displays have attributes of good brightness and contrast, wide viewing angles, state bistability, and low power consumption when compared with liquid crystal displays. Nevertheless, problems with the long-term image quality of these displays has, to date, prevented their widespread usage.

The recent invention of encapsulated electrophoretic displays solves many of these problems and offers additional advantages compared to liquid crystal displays. Some added advantages are the ability to print or coat the display material on a wide variety of flexible and rigid substrates. The clustering and settling problems, which plagued prior art electrophoretic displays and resulted in inadequate lifetimes for the displays are now overcome.

The purpose of this disclosure is to describe electrophoretic displays, especially encapsulated electrophoretic displays, and classes of materials, as well as some specific materials, which should be useful in their construction.

SUMMARY OF THE INVENTION

The successful construction of an encapsulated electrophoretic display requires the proper interaction of several different types of materials and processes. Materials such as a polymeric binder, a capsule membrane, and the electrophoretic particles and fluid must all be chemically compatible. The capsule membranes may engage in useful surface interactions with the electrophoretic particles, or may act as an inert physical boundary between the fluid and the binder. Polymer binders may set as adhesives between capsule membranes and electrode surfaces.

In some cases, a separate encapsulation step of the process is not necessary. The electrophoretic fluid may be directly dispersed or emulsified into the binder (or a precursor to the binder material) to form what may be called a "polymer-dispersed electrophoretic display". In such displays, the individual electrophoretic phases may be referred to as capsules or microcapsules even though no capsule membrane is present. Such polymer-dispersed electrophoretic displays are considered to be subsets of encapsulated electrophoretic displays.

In an encapsulated electrophoretic display, the binder material surrounds the capsules and separates the two bounding electrodes. This binder material must be compatible with the capsule and bounding electrodes and must possess properties that allow for facile printing or coating. It may also possess barrier properties for water, oxygen, ultraviolet light, the electrophoretic fluid, or other materials. Further, it may contain surfactants and cross-linking agents, which could aid in coating or durability. The polymer-dispersed electrophoretic display may be of the emulsion or phase separation type.

The present invention provides electrophoretic displays, particularly encapsulated electrophoretic displays, and materials for use in such displays. The capsules may be spherical or non-spherical in shape. In electrophoretic displays, at least some of the particles are moved or rotated by application of electric fields. The electric field may be an alternating-current field or a direct-current field. The electric field may be created by at least one pair of electrodes disposed adjacent a binder material containing the particles. The particles may be absorbing pigments, scattering pigments or luminescent particles, for example. The particles may be made up of some combination of dye, pigment, polymer.

Such displays may also include, for example, one type of particle that retroreflects, or substantially retroreflects, light and another type that absorbs light. Application of an electric field may cause the particles in an encapsulated display to orient so that the capsule retroreflects, or substantially retroreflects, light. Application of another electric field may cause the particles to orient so that the capsule absorbs, or does not retroreflect, light. A display may also include a reflective substrate, so that orientation of one type of particle in a particular pattern causes light to pass through the capsule to the substrate, which reflects light. Orientation of a second type of particle in a particular pattern causes the capsule to absorb, or otherwise not reflect, light. Types of retroreflective and reflective materials that may be used in constructing a retroreflective or reflective substrates, respectively, include glass spheres and diffractive reflecting layers.

Another type of display has particles of differing colors. Such a display has at least two, and preferably at least, three different species of particles, with each type of particle having a different electrophoretic mobility. The different electrophoretic mobilities provide the particles with substantially non-overlapping electrophoretic mobilities, so that application of different electric fields causes different subsets of the colored particles to be viewed at the surface of the capsule.

Another type of display includes luminescent particles and a visible light-blocking medium, which may contain light-absorbing particles or dyes. Application of different electric fields may cause the particles to luminesce selectively or uniformly at the front (eyes see a bright pixel) or rear (fluid absorbs radiation) of the capsule. Application of different electric fields may cause either the luminescent particles or the light-blocking particles to rise to the capsule surface, resulting in either a light or a dark appearance to the capsule, respectively.

In another type of electrophoretic display, the particles may themselves be encapsulated pigments, dyes, pigment dispersions, dye solutions, or a combination of any of these. These particles are dispersed in a suspending fluid and are then encapsulated into capsules in a binder. The particles may be dispersed within a suspending fluid and may each contain a plurality of solid particles or a dye or both. The suspending fluid can be a single fluid or a mixture of two or more fluids. In one embodiment, the particles may have a diameter from between about 10 nm and about 5 $\mu$m, whereas the capsules may have a diameter from between about 5 $\mu$m and about 200 $\mu$m. In another embodiment, the particles may have a flexible outer surface or may be a polymeric layer surrounding a dye or dye solution.

The advantage of this system is that known emulsification or encapsulation techniques can be used to make improved particles, with better control of absorbance, optical properties, charge, mobility, shape, size, density, surface chemistry, stability, and processibility. There are vast numbers of dyes and/or particles and liquids of all polarities that can be used to gain a high level of control over the optical properties of the system. It is possible to create particles which are capsules containing dyes and/or particles in order to obtain properties difficult to achieve with pigments. The present invention relates to these encapsulated electrophoretic displays and the materials, such as dyes, pigments, binder, etc. that may be useful in their construction.

Encapsulated electrophoretic displays may include two or more different types of particles. Such displays may include, for example, displays containing a plurality of anisotropic particles and a plurality of second particles in a suspending fluid. Application of a first electric field may cause the anisotropic particles to assume a specific orientation and present an optical property. Application of a second electric field may then cause the plurality of second particles to translate, thereby disorienting the anisotropic particles and disturbing the optical property. Alternatively, the orientation of the anisotropic particles may allow easier translation of the plurality of second particles. The particles may have a refractive index that substantially matches the refractive index of the suspending fluid.

Finally, an encapsulated display may comprise an electro-osmotic display. Such a display may comprise capsules containing a refractive index matching fluid, that moves within the capsule to create a homogeneous capsule upon application of an electric field. The capsule may also contain a porous internal material, such as an alkylcellulose, that swells upon movement of the refractive index matching fluid within the capsule. An electro-osmotic display may also include two or more immiscible fluids, that move within the capsule to create a different optical property upon application of an electric field. The optical effect may result from a planar index mismatch or a non-planar index mismatch.

Materials for use in creating electrophoretic displays relate to the types of materials, including, but not limited to, particles, dyes, suspending fluids, and binders used in fabricating the displays. In one embodiment, types of particles that may be used to fabricate suspended particle displays include scattering pigments, absorbing pigments and luminescent particles. Such particles may also be transparent. Preferred particles include titania, which may be coated in one or two layers with a metal oxide, such as aluminum oxide or silicon oxide, for example. Such particles may also be retroreflective or have a reflective coating. Such particles may be constructed as corner cubes. Luminescent particles may include, for example, zinc sulfide particles. The zinc sulfide particles may also be encapsulated with an insulative coating to reduce electrical conduction. Light-blocking or absorbing particles may include, for example, dyes or pigments.

A suspending (i.e., electrophoretic) fluid may be a high resistivity fluid. The suspending fluid may be a single fluid, or it may be a mixture of two or more fluids. The suspending fluid, whether a single fluid or a mixture of fluids, may have its density substantially matched to that of the particles within the capsule. The suspending fluid may be a halogenated hydrocarbon, such as tetrachloroethylene, for example. The halogenated hydrocarbon may also be a low molecular weight polymer. One such low molecular weight polymer is poly(chlorotrifluoroethylene). The degree of polymerization for this polymer may be from about 2 to about 10.

Types of dyes for use in electrophoretic displays are commonly known in the art. They may be soluble in the suspending fluid. These dyes may further be part of a polymeric chain. Dyes may be polymerized by thermal, photochemical, and chemical diffusion processes. Single dyes or mixtures of dyes may also be used.

Furthermore, capsules may be formed in, or later dispersed in, a binder. Materials for use as binders include water-soluble polymers, water-dispersed polymers, oil-soluble polymers, thermoset polymers, thermoplastic polymers, and uv- or radiation-cured polymers.

The invention will be understood further upon consideration of the following drawings, description and claims.

DESCRIPTION OF THE DRAWINGS

Like reference characters in the drawings represent corresponding parts.

DETAILED DESCRIPTION OF THE INVENTION

Figure 1:
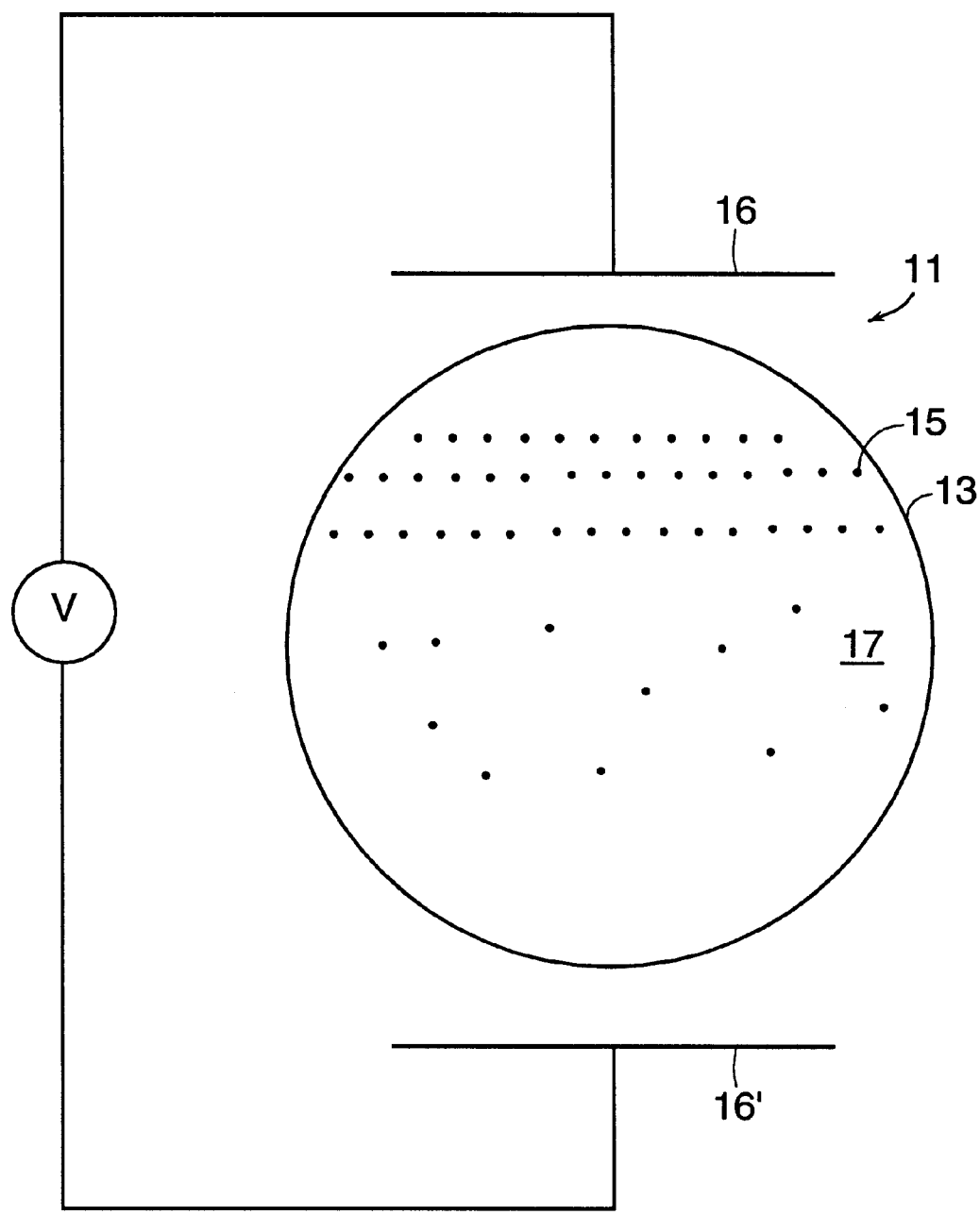
FIG. 1 is a schematic representation of encapsulated light scattering particles.

This invention relates to improved encapsulated electrophoretic displays and materials useful in their construction. Generally, an encapsulated electrophoretic display includes one or more species of particle that either absorb or scatter light. One example is a system in which the capsules contain one or more species of electrophoretically mobile particles dispersed in a dyed suspending fluid. Another example is a system in which the capsules contain two separate species of particles suspended in a clear suspending fluid, in which one species of particle absorbs light (black), while the other species of particle scatters light (white). There are other extensions (more than two species of particles, with or without a dye, etc.). The particles are commonly solid pigments, dyed particles, or pigment/polymer composites.

Electrophoretic displays of the invention are described below. These displays are preferably microencapsulated electrophoretic displays. Also described below are materials that may be useful in such displays.

I. Electrophoretic Displays

An object of the invention is to provide a highly-flexible, reflective display which can be manufactured easily, consumes little (or no in the case of bistable displays) power, and can, therefore, be incorporated into a variety of applications. The invention features a printable display comprising an encapsulated electrophoretic display medium. The resulting display is flexible. Since the display media can be printed, the display itself can be made inexpensively.

An encapsulated electrophoretic display can be constructed so that the optical state of the display is stable for some length of time. When the display has two states which are stable in this manner, the display is said to be bistable. If more than two states of the display are stable, then the display can be said to be multistable. For the purpose of this invention, the term bistable will be used to indicate a display in which any optical state remains fixed once the addressing voltage is removed. The definition of a bistable state depends on the application for the display. A slowly-decaying optical state can be effectively bistable if the optical state is substantially unchanged over the required viewing time. For example, in a display which is updated every few minutes, a display image which is stable for hours or days is effectively bistable for that application. In this invention, the term bistable also indicates a display with an optical state sufficiently longlived as to be effectively bistable for the application in mind. Alternatively, it is possible to construct encapsulated electrophoretic displays in which the image decays quickly once the addressing voltage to the display is removed (i.e., the display is not bistable or multistable). As will be described, in some applications it is advantageous to use an encapsulated electrophoretic display which is not bistable. Whether or not an encapsulated electrophoretic display is bistable, and its degree of bistability, can be controlled through appropriate chemical modification of the electrophoretic particles, the suspending fluid, the capsule, and binder materials.

An encapsulated electrophoretic display may take many forms. The display may comprise capsules dispersed in a binder. The capsules may be of any size or shape. The capsules may, for example, be spherical and may have diameters in the millimeter range or the micron range, but is preferably from ten to a few hundred microns. The capsules may be formed by an encapsulation technique, as described below. Particles may be encapsulated in the capsules. The particles may be two or more different types of particles. The particles may be colored, luminescent, light-absorbing or transparent, for example. The particles may include neat pigments, dyed (laked) pigments or pigment/polymer composites, for example. The display may further comprise a suspending fluid in which the particles are dispersed.

In electrophoretic displays, the particles may be oriented or translated by placing an electric field across the capsule. The electric field may include an alternating-current field or a direct-current field. The electric field may be provided by at least one pair of electrodes disposed adjacent to a display comprising the capsule.

Throughout the specification, reference will be made to printing or printed. As used throughout the specification, printing is intended to include all forms of printing and coating, including: premetered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; and other similar techniques. A "printed element" refers to an element formed using any one of the above techniques.

FIG. 1 shows an electrophoretic display of the invention. The binder 11 includes at least one capsule 13, which is filled with a plurality of particles 15 and a dyed suspending fluid 17. In one embodiment, the particles 15 are titania particles. When a direct-current electric field of the appropriate polarity is applied across the capsule 13, the particles 15 move to the viewed surface of the display and scatter light. When the applied electric field is reversed, the particles 15 move to the rear surface of the display and the viewed surface of the display then appears dark.

Figure 2:
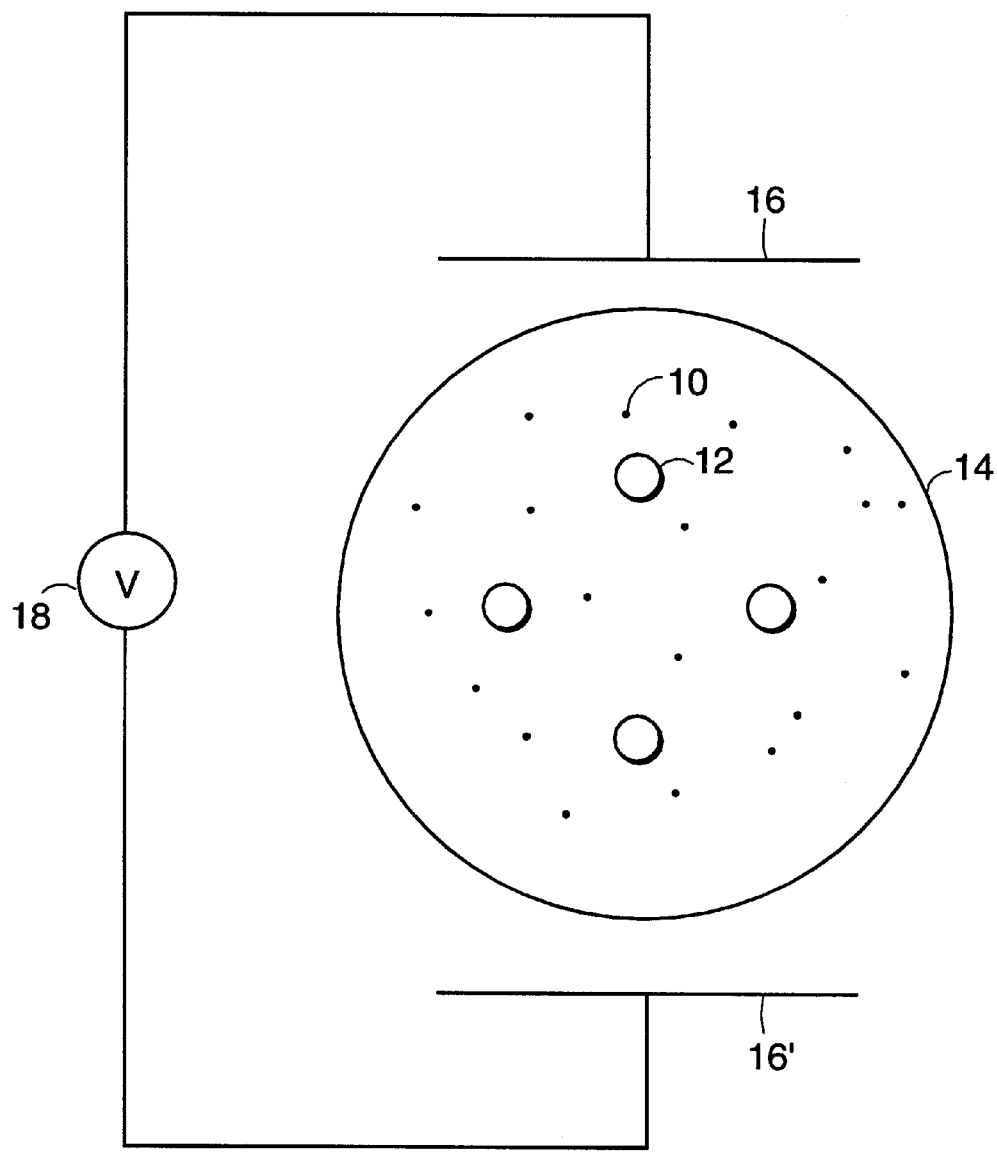
FIG. 2 shows a capsule containing particles in a suspending fluid and having a pair of electrodes disposed adjacent thereto.

FIG. 2 shows an electrophoretic display of the invention. This display comprises anisotropic particles 10 and a second set of particles 12 in a capsule 14. The capsule has electrodes 16 and 16' disposed adjacent it. The electrodes are connected to a source of voltage 18, which may provide an alternating-current (AC) field or a direct-current (DC) field to the capsule 14. In this display, the anisotropic particles 10 are oriented by an AC field so as to allow light to pass through the capsule. Brownian motion normally slowly restores the particles to an isotropic state. In this display, a clear index of refraction matched second set of particles 12 is, however, used to provide internal turbulence and disorient the anisotropic particles. Applying a DC field that is switched back and forth at a much lower frequency causes the second set of particles to translate and disturb any oriented anisotropic particles. This will cause the display to reset to its scattering state much more quickly. The display cell appears dark upon disorientation of the anisotropic particles. This scheme will work in an encapsulated, polymer dispersed, or normal liquid cell.

Figure 3:
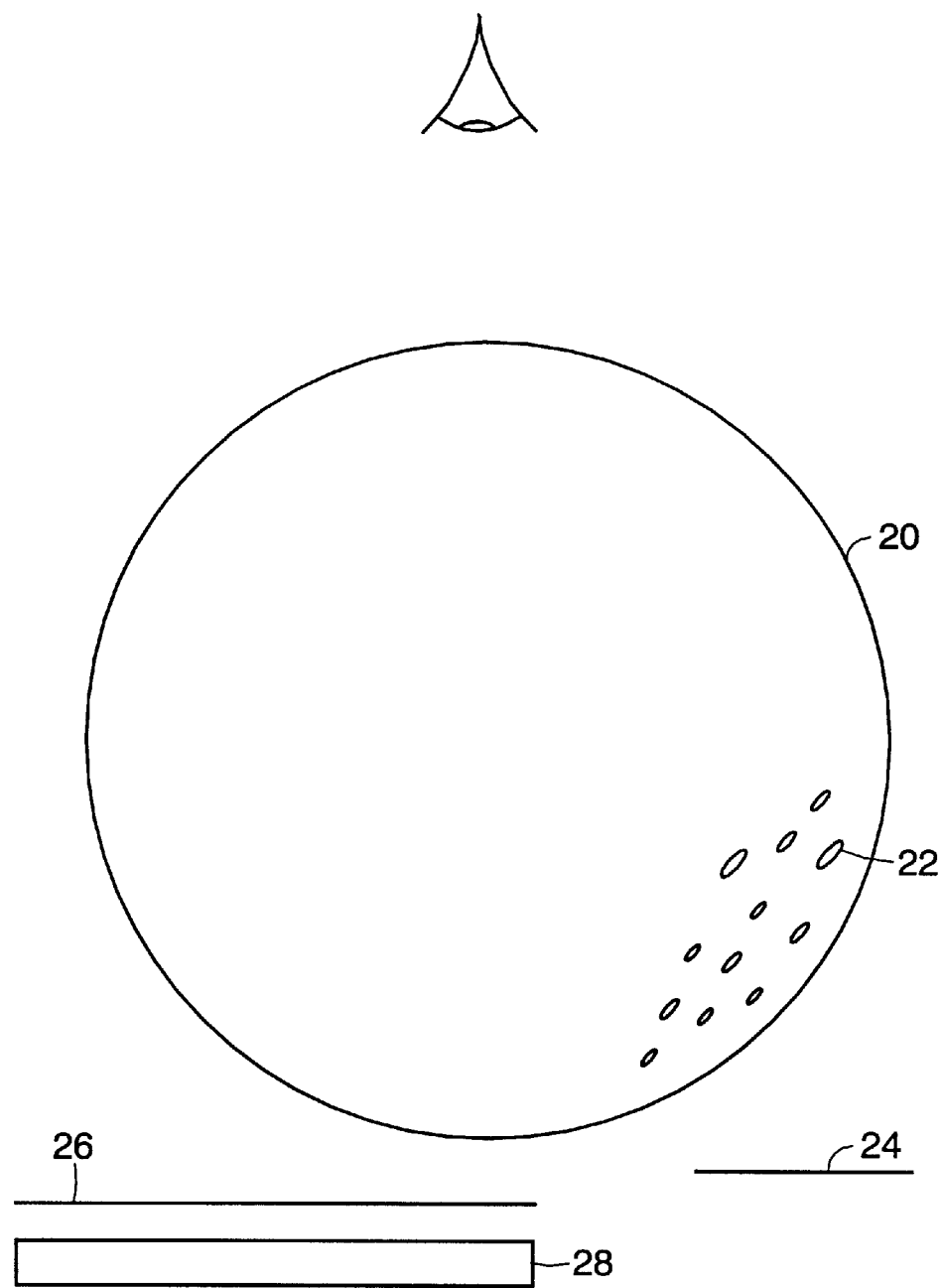
FIG. 3 shows a capsule containing light-absorbing particles in a suspending fluid and having a reflective or retroreflective substrate disposed at the bottom face of the capsule. The particles are shown moved toward one of the pair of electrodes so that light can pass through the capsule and be reflected by the substrate.
Figure 4:
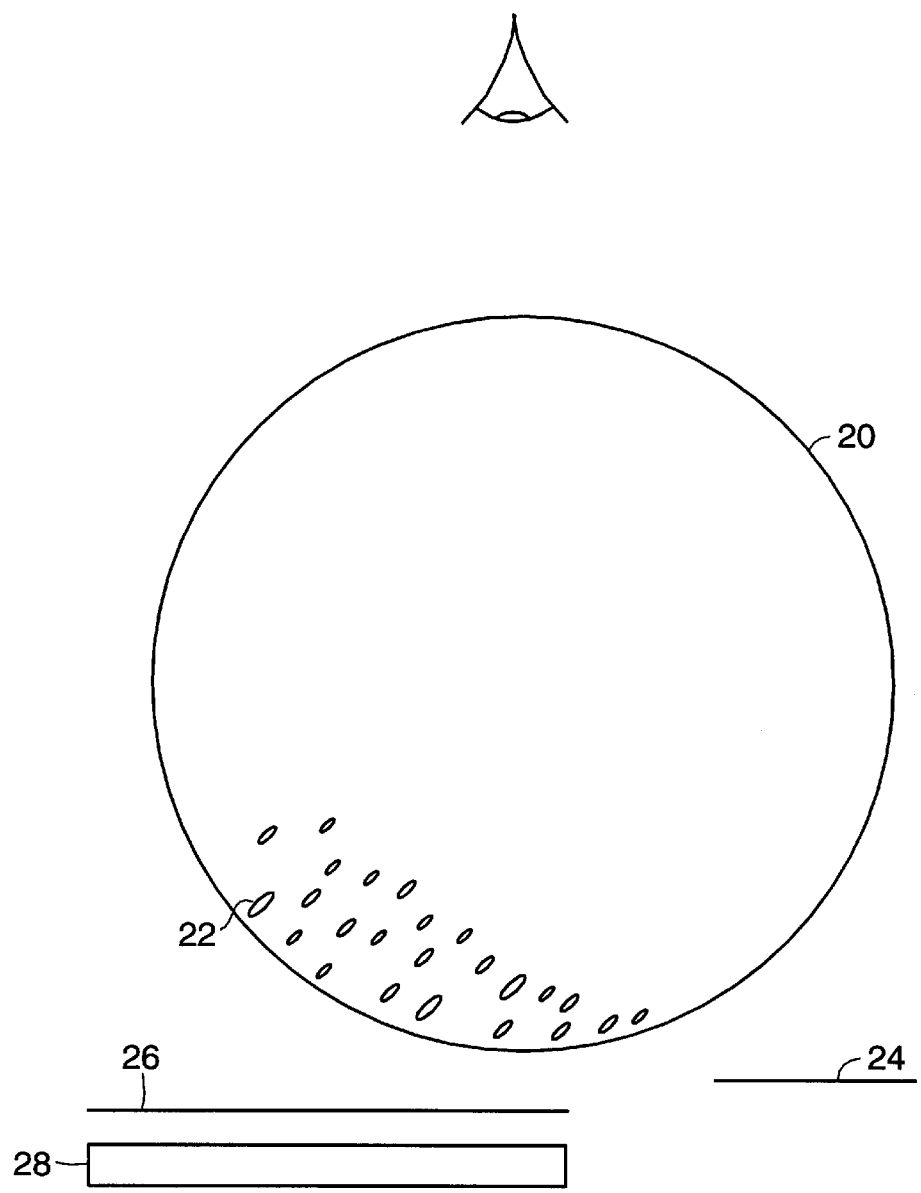
FIG. 4 shows the capsule of FIG. 3 in which the particles are moved to block light from reaching the substrate, thereby preventing light from being reflected by the substrate.

In another embodiment of the invention, an electrophoretic display that uses a retroreflecting surface is described. This implementation need not be encapsulated, but rather may also be embodied in the form of a standard electrophoretic display. FIGS. 3 and 4 show such a display.

In FIG. 3, capsule 20 is filled with a suspending fluid, which may be a fluid of high resistivity and particles 22. When the particles are attracted towards electrode 24 by the application of an electric field, the particles take up a minority of the viewable area of the display. This exposes clear electrode 26 and allows the light to reflect off the surface 28. This surface may be composed of glass spheres, a diffractive reflecting layer, such as a holographically formed reflector, for example, any other known retroflecting surface, or any other surface which contrasts with the particles. The capsule then has the appearance of substrate 28.

In FIG. 4, the second state of the capsule is displayed. Particles 22 contained within capsule 20 migrate towards electrode 26 by the application of an electric field. These particles thus obscure surface 28, and the capsule, when viewed from the top, then appears to have the properties of the particle.

Figure 5:
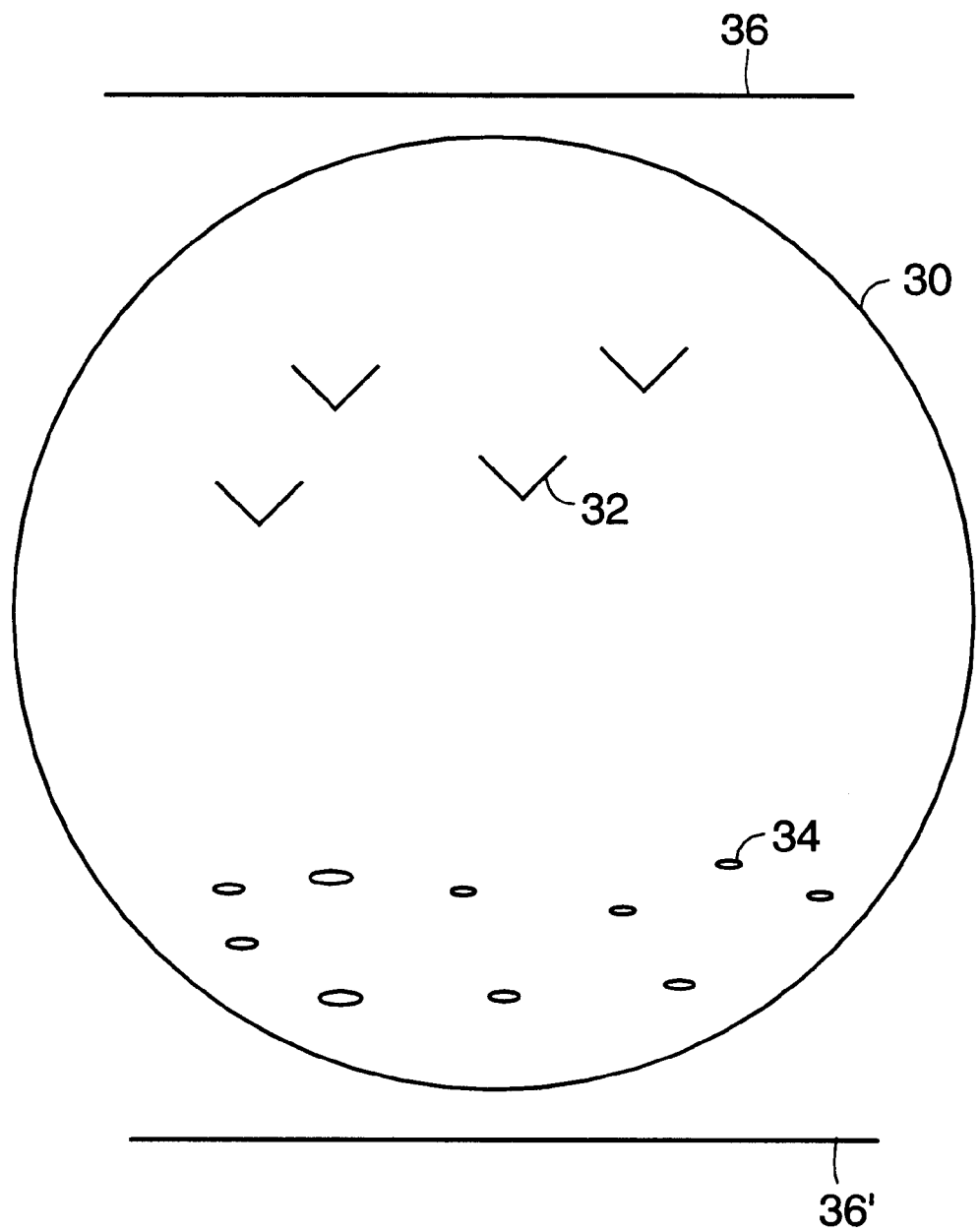
FIG. 5 shows a capsule containing light-absorbing particles and retroreflecting particles.

FIG. 5 shows another embodiment of the invention. In this embodiment, a reflective display may be made selectively retroreflective by manipulating charged particles to either block a retroreflective light path or create a retroreflective surface. In this embodiment, capsule 30 contains retroreflecting particles 32 and black particles 34. The retroreflective particles may include retroreflecting corner cubes or hemispherically reflective coated particles, for example. Upon application of an appropriate voltage between electrodes 36 and 36', the black particles 34 may move to the viewing surface of the display creating a dark state. When the retroreflective particles may move to the top surface of the display by application of a different electric field, they create a retroreflective surface resulting in a bright state.

Figure 6A:
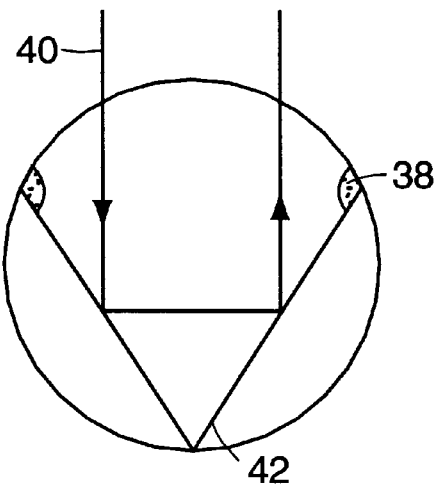
FIG. 6A shows a capsule containing a reflecting corner cube at its bottom face and particles. In this illustration, the particles are positioned so that light can pass through the capsule and be reflected by the corner cube.
Figure 6B:
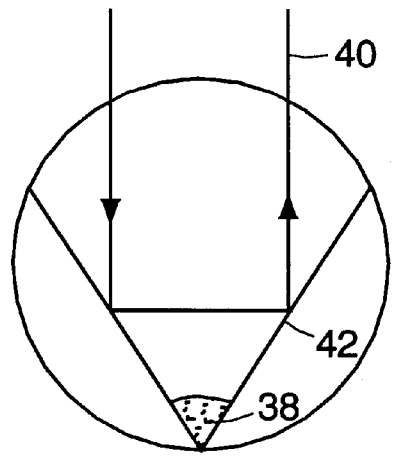
FIG. 6B shows a capsule containing a reflecting corner cube at its bottom face and particles. In this illustration, the particles are positioned so that light can pass through the capsule and be reflected by the corner cube.
Figure 6C:
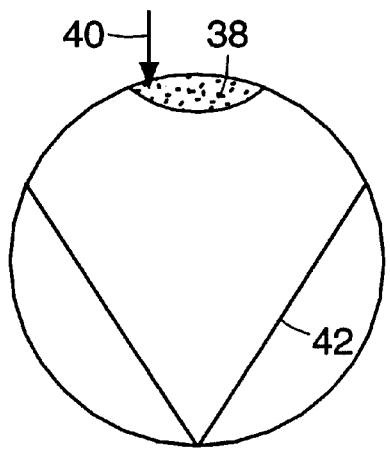
FIG. 6C shows a microcapsule containing a reflecting corner cube at its bottom face and particles. In this illustration, the particles are positioned so that light cannot pass through the capsule and be reflected by the corner cube.

In another embodiment, a display which may be made selectively retroreflective is described. In general, the display works by manipulating charged particles to either block a retroreflective light path or create a retroreflective surface. The particles move (electrophoretically, for example) within a capsule. FIGS. 6A–6C show the contemplated configurations.

The capsule is situated in a two or three-dimensional corner cube-type structure, which may be created by embossing or other means. In two states, as shown in FIGS. 6A and 6B, the particles 38 allow light 40 to pass through and be reflected by the corner cube 42. In a third state, however, as shown in FIG. 6C, the particles 38 block most of the incident light 40 from being retroreflected by the corner cube 42.

Figure 7:
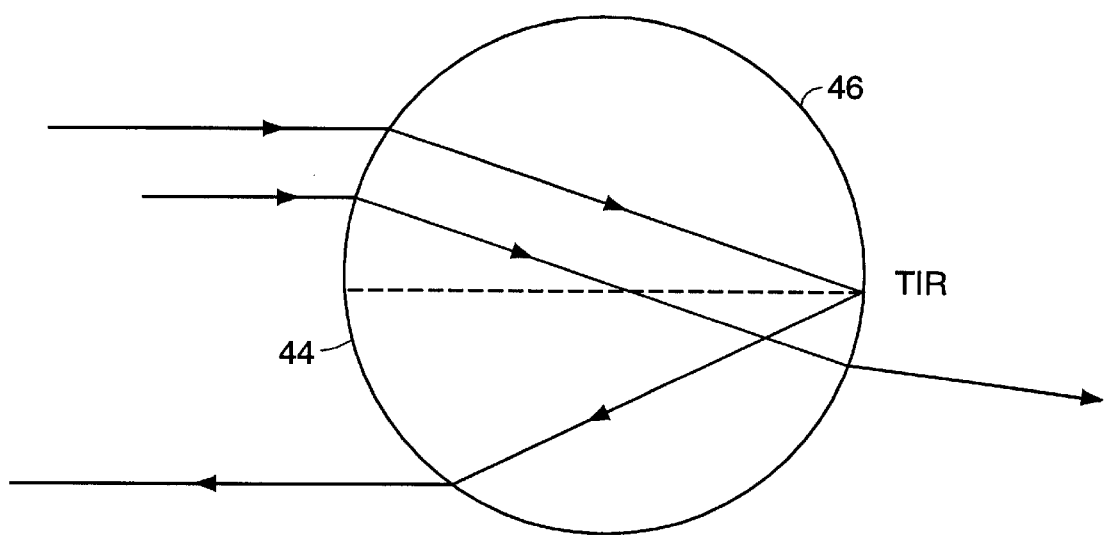
FIG. 7 shows how a capsule may reflect light.

In another embodiment, shown in FIG. 7, a single capsule acts as a retroreflector, much as a glass bead does. Only light that enters the incident side 44 at a vertical displacement at a distance from the center greater than a critical distance y will strike the totally internal reflecting (TIR) side 46 at an angle great enough to be totally internally reflected. This light strikes the TIR side near its center. Thus, on the incident side 44, the retroreflective effect occurs away from the center axis. On the TIR side 46, however, most retroreflective action occurs at the vertical center.

Figure 8B:
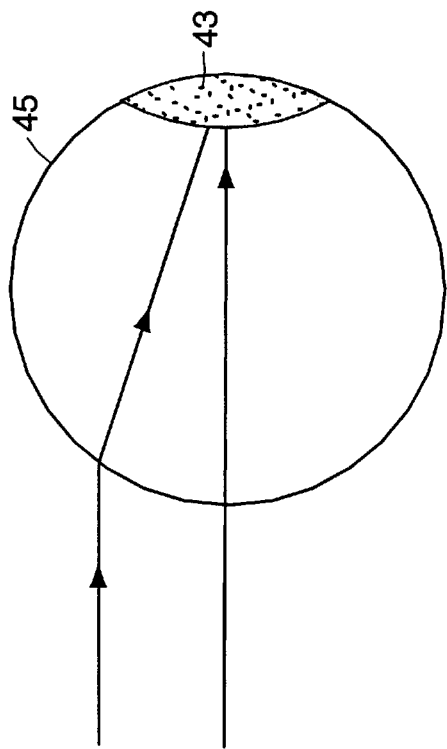
FIG. 8B shows a capsule of FIG. 7 in which particles contained within the capsule are positioned so as to prevent light entering the capsule from being reflected.
Figure 8A:
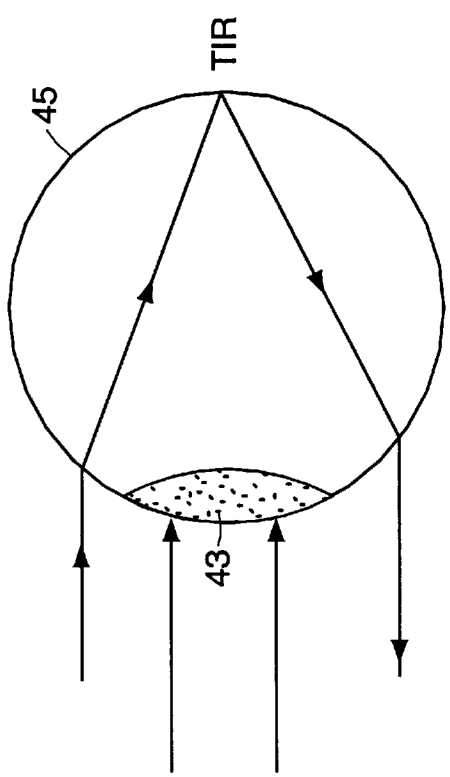
FIG. 8A shows a capsule of FIG. 7 in which particles contained within the capsule are positioned so as to allow light to enter the capsule and be reflected.

Thus, a retroreflective electronically addressable display can be constructed in which the retroreflective and non-retroreflective states are as illustrated in FIGS. 8A and 8B. In FIG. 8A, the particles 43 are shown toward the front face of the capsule 45. This configuration allows light to enter and be reflected from the TIR side of the capsule. In FIG. 8B, the particles 43 are shown toward the bottom face of the capsule 45. In this configuration, the particles block the path of the light and thereby prevent it from being reflected from the TIR side of the capsule.

In short, any configuration in which particles can be rearranged in a capsule or capsular cavity in a binder, with or without an external physical retroreflector, to switch from a retroreflected to a non-retroreflected state is contemplated.

In another embodiment of the invention, a multi-color, encapsulated electrophoretic display is contemplated. In this embodiment, the display, which may comprise a capsule, is filled with at least one suspending fluid and at least two, and preferably at least three, species of particles. These particles are of different colors and possess substantially non-overlapping electrophoretic mobilities. As used herein, the phrase "substantially non-overlapping electrophoretic mobilities" means that less than 25%, and preferably less than 5%, of the particles of different colors have the same or similar electrophoretic mobilities. As an example, in a system having two species of particles, less than 25% of particles of one species would have the same or similar electrophoretic mobilities as the particles in the other species. Finally, in an alternative embodiment, one of the colors may be represented by a dye dispersed in the suspending fluid.

As an example of a multi-color, encapsulated electrophoretic display, there may be magenta particles with an average zeta potential of 100 mV, cyan particles with an average zeta potential of 60 mV, and yellow particles with an average zeta potential of 20 mV. To address this display to the magenta state, all the particles are pulled to the back of the cell by applying an electric field in one direction. Subsequently, the field is reversed for just long enough for the magenta particles to move to the top face of the display cell. The cyan and yellow particles will also move in this reversed field, but they will not move as quickly as the magenta particles, and thus will be obscured by the magenta particles.

To address the display to the cyan state, all the particles are pulled to the back of the cell by applying an electric field in one direction. Then the field is reversed for just long enough for the magenta and cyan particles to move to the top face of the display cell. The field is then reversed again and the magenta particles, moving faster than the cyan particles, leave the cyan particles exposed at the top of the display.

Finally, to achieve a yellow display, all the particles are pulled to the front of the display. The field is then reversed and the yellow particles, lagging behind the magenta and cyan particles are exposed at the front of the display.

A display using field effect luminescence is also an embodiment of the invention. An example of a field effect luminescent embodiment of the invention requires about 300–400 Hz AC voltage. This high frequency does not, however, produce any net displacement of the luminescent particles. The luminescent particles are generally conductive. Encapsulation in a polymer or other dielectric material is, therefore, useful for reducing conductivity.

Figure 9:
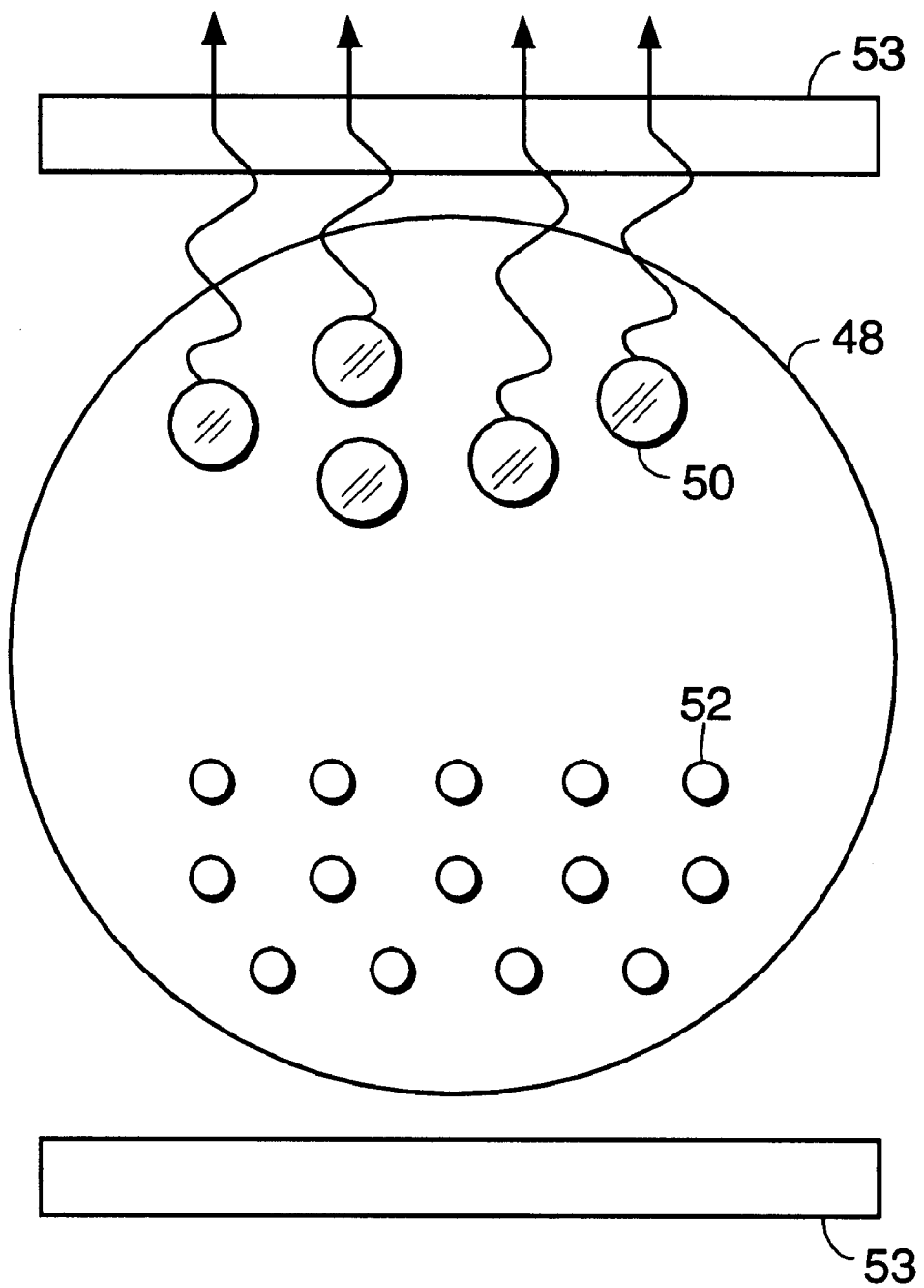
FIG. 9 shows a capsule containing luminescent particles and light-absorbing particles. In this illustration, the luminescent particles are positioned toward the top face of the capsule, thereby providing light.
Figure 10:
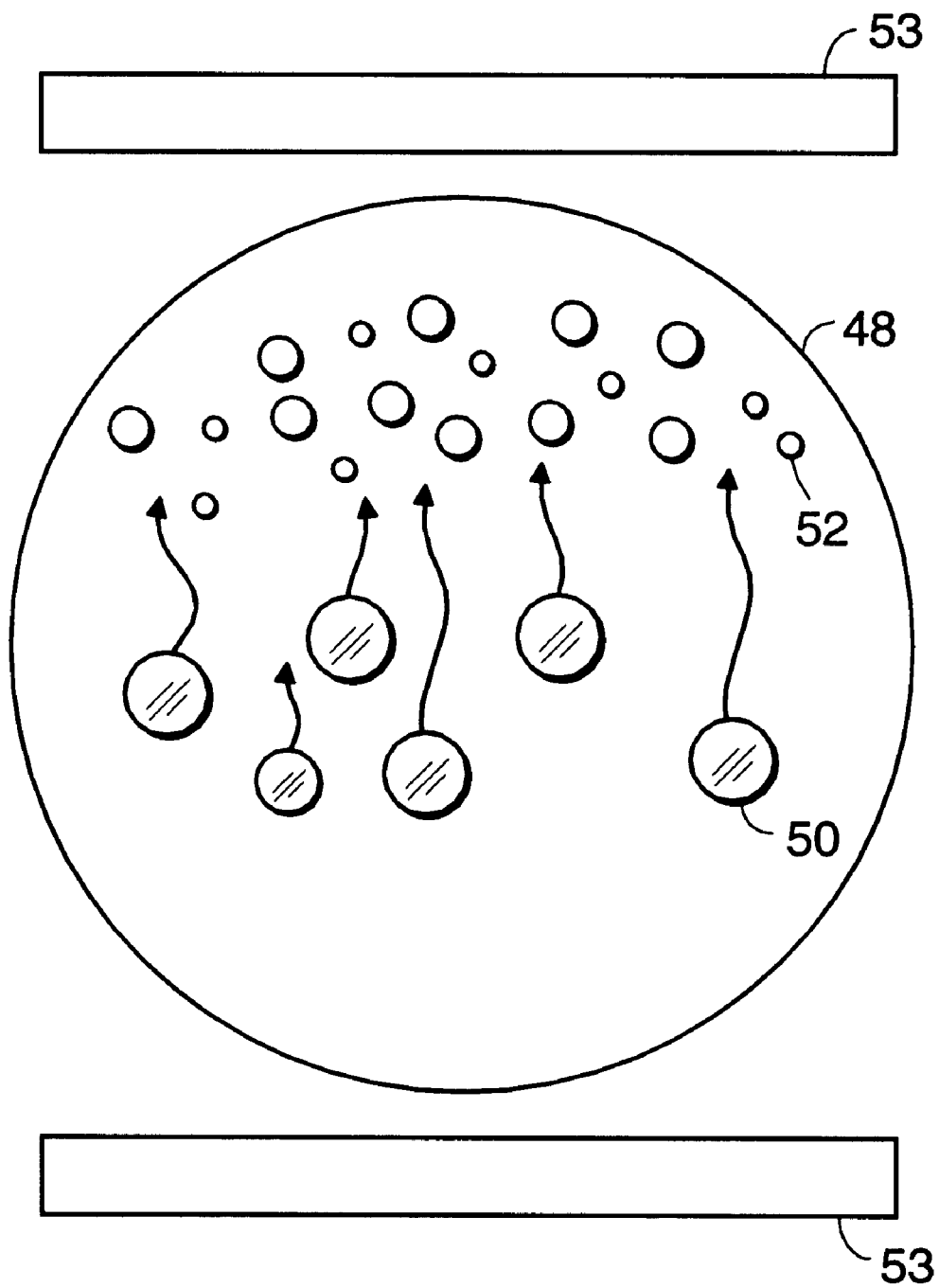
FIG. 10 shows a capsule of FIG. 9 in which the light-absorbing particles are positioned toward the top face of the capsule, thereby blocking light from exiting the capsule.

FIGS. 9 and 10 show a display cell 48 of this embodiment in its white and darkened states, respectively. The luminescent particles 50 may be, for example, zinc sulfide particles, which emit light when excited by an AC electric field. The AC field can be superimposed on top of, or after, a DC field used for addressing the particles or dye. A second species of particle 52 in the fluid blocks the light being emitted from the particles when the display is addressed to its darkened state.

Upon application of a DC field by the two electrodes 53, the luminescent particles 50 migrate to the viewing face of the display 48 and are excited to emit light, resulting in a bright state. Upon application of an electric field of the opposite polarity, the luminescent particles 50 migrate to the back face of the display 48, and the light-blocking particles 52 block the light being emitted from the luminescent particles 50 from the viewing face of the display, resulting in a dark state. The luminescent particles may be photoluminescent or electroluminescent. Photoluminiscent particles may be stimulated by continuous ultraviolet, or other, radiation from the front of the display, or the illumination source may be behind the display. In the latter case, the dye or second species of particle allows ultraviolet radiation to pass through the display.

In another embodiment of the invention, the electrophoretic display comprises a capsule in a binder, the capsule containing a plurality of particles which are themselves encapsulated pigments, dyes, dispersions or dye solutions. In this embodiment, a pigment, for example, is encapsulated to form particles ranging from tens of nanometers to a few micrometers, which are then dispersed and encapsulated. Examples include scattering pigments, absorbing pigments, or luminescent particles. These particles are then used as the electrophoretic particles. Furthermore, in this embodiment of the invention, it is possible to encapsulate a dye solution and use it as the electrophoretic particle.

Furthermore, in this embodiment, it is possible to encapsulate not only a fluid dye or a particle, but also a fluid dye plus solid particles. These particles possess their own optical or electrical properties, which complement may those of the dye.

These encapsulated particles may be useful for both encapsulated electrophoretic displays and non-encapsulated electrophoretic displays. The average diameter for a particle is in the range of about 10 nm to about 5 $\mu$m in diameter. These capsules need to be small enough to be mobile within the larger capsule, which typically has a size ranging from about 5 $\mu$m to about 400 $\mu$m in diameter.

In another embodiment of the invention, an encapsulated electro-osmotic display is described. In this embodiment, a porous or gel-like internal phase of a capsule is swelled (ie., filled) and drained by the electro-osmotically induced motion of a refractive index matching fluid (ie., the difference between the refractive index of the fluid and the refractive index of the internal phase is preferably within 0.5). When the pores of the material are filled with the fluid, the capsule acts as a homogeneous optical material, thus largely transmitting or refracting light according to the bulk properties of the medium. When the pores are vacated by the mobile fluid, however, a larger quantity of optical index mismatches are present and light scattering is greatly increased.

The porous internal phase of the capsule may include a cellulosic material, such as an alkylcellulose. Examples of alkylcelluloses include, but are not limited to, methylcellulose, methylhydroxyethylcellulose, hydroxyethylcellulose, hydroxypropylmethylcellulose, carboxymethylcellulose, and sodium carboxymethylcellulose.

In a preferred embodiment of the invention, the capsules of the electrophoretic display have a non-spherical shape. There are some optical losses associated with encapsulated electrophoretic displays compared to unencapsulated displays due to absorption or scattering by the capsule materials, and absorption or scattering of the binder. Many of these losses result from spherical cavities. It is, therefore, advantageous to provide a non-spherical microcapsule, specifically a close picked array of non-spherical cavities. It is desirable that the top of the microcapsule have a flat surface that is co-planar with the viewing electrode and vertical, or nearly vertical, walls. The capsule may be a slightly flattened sphere, a heavily flattened sphere, essentially cylindrical in shape, or a multi-faceted polyhedron, for example.

A display with non-spherical capsules may be a binder having oil-containing cavities that are non-spherical in shape. These oil-containing cavities may be elastomeric capsules. In a preferred embodiment, the aspect ratio (i.e., ratio of width to height) of these cavities is preferably greater than about 1.2. The aspect ratio is more preferably greater than about 1.5, and, in a particularly preferred embodiment, the aspect ratio is greater than about 1.75. In a preferred embodiment, a display having non-spherical capsules has a volume fraction (i.e., fraction of total volume) of binder between about 0 to about 0.9. More preferably, the volume fraction is between about 0.05 and about 0.2.

Displays of this type have both a rear surface and a viewed surface. In a preferred embodiment, the viewed surface is substantially planar. As used herein, the phrase "substantially planar" means a curvature (i.e., inverse of a radius of curvature) of less than about 2.0 m. In a particularly preferred embodiment, both the rear and viewed surfaces are substantially planar. Furthermore, embodiments of such displays will preferably have an optically active fraction (ie., percentage of total surface area that can change optical properties) of greater than about 80%, and more preferably greater than about 90%.

Non-spherical microcapsules can be formed during the encapsulation phase, by, for example, using a non-uniform shear field or a compressive pressure. Such non-spherical capsules can also be formed during the processing of the display when the binder is drying or curing. In such a system, as the binder shrinks, it pulls capsules close to one another and pulls the capsules down toward the substrate on which they have been coated. For example, an aqueous evaporative binder, such as a waterbourne acrylic, urethane, or poly (vinyl alcohol), for example, tends to exhibit such shrinking properties. Any other evaporative binder, emulsion, or solution would also be suitable. The solvent need not be water, but can be an organic liquid or a combination of liquids.

Such non-spherical capsules can be formed by applying a force to the film as it is drying or curing to deform permanently the capsules. Such a force can be applied by a pair of rollers, by a vacuum lamination press, by a mechanical press, or by any other suitable means. Such non-spherical capsules can also be formed by stretching the cured film in one or both of the planar axes of the film. After completion of the curing process, the capsule can protrude above the surface of the cured film resulting in a lens effect that enhances the optical properties of the capsule. Finally, the capsule can also be of a material which softens in the binder, thus allowing a flattened capsule when the capsules and binder are laid down and the binder is allowed to cure.

In another embodiment, a polymer-dispersed electrophoretic display is constructed in a manner similar to a polymer-dispersed liquid crystal display. As the binder dries or cures, the encapsulated phase is pulled into non-spherical cavities.

An electrophoretic display is constructed as either an encapsulated electrophoretic display or a polymer-dispersed electrophoretic display (similar in construction to a polymer dispersed liquid crystal display), and the capsules or liquid droplets are formed non-spherically, by flattening, by shrinkage of the binder, or by mechanical force. In each case, the capsules should be capable of deforming, or they may rupture. In the case of a polymer-dispersed electrophoretic display, the encapsulated phases change shape as the polymer shrinks. In addition, the encapsulated phases may be deformed asymmetrically by stretching the substrate. Another technique which may be employed is to first dry the binder in such a way that a tough top skin is formed. The rest of the binder may then be dried slowly with no fear of the top surface breaking or becoming too uneven.

The electrodes adjacent the electrophoretic display may include conducting polymers, such as polyaniline, for example. These materials may be soluble, enabling them to be coated by, for example, web coating.

Figure 11:
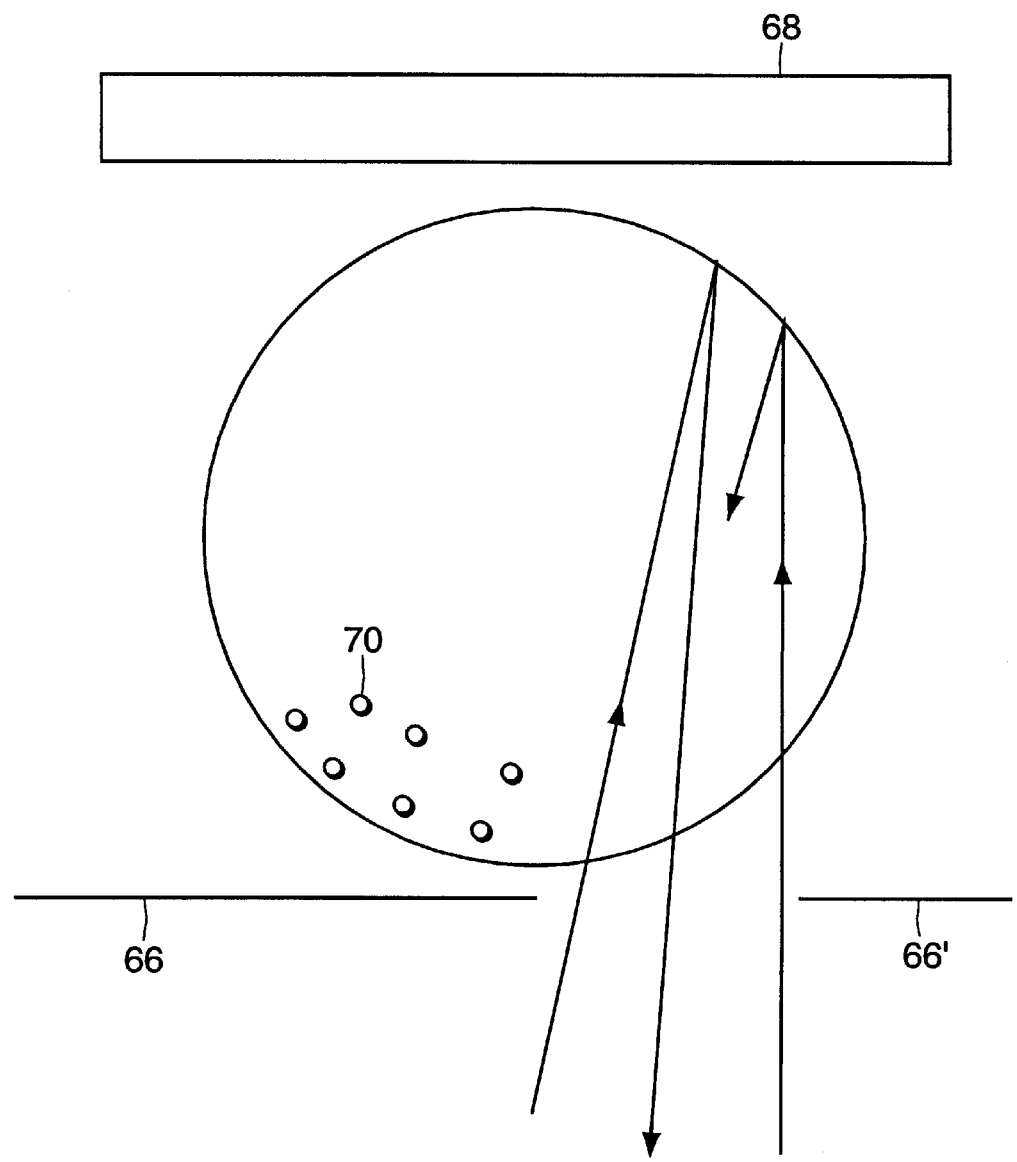
FIG. 11 shows a capsule disposed adjacent a reflective substrate and two electrodes, in which the particles within the capsule are aligned so as to allow light to pass through the capsule and be reflected by the substrate.

A means for addressing an encapsulated electrophoretic display (or other display) structure is also described. Referring to FIG. 11, electrodes 66 and 66' are present on one side of the display. These electrodes may be part of a head ("stylus") which is scanned over the display. There may be more, less, or exactly one capsule per electrode pair. Application of a DC field to the pixel moves the particles to one side and exposes substrate 68 beneath (e.g., a mirror, a retroflective coating, a diffuse reflective coating, etc.). Under the influence of an AC field, the particles 70 may be distributed throughout the space and cause a largely dark pixel appearance. The electrodes themselves may be clear or opaque.

Figure 12A:
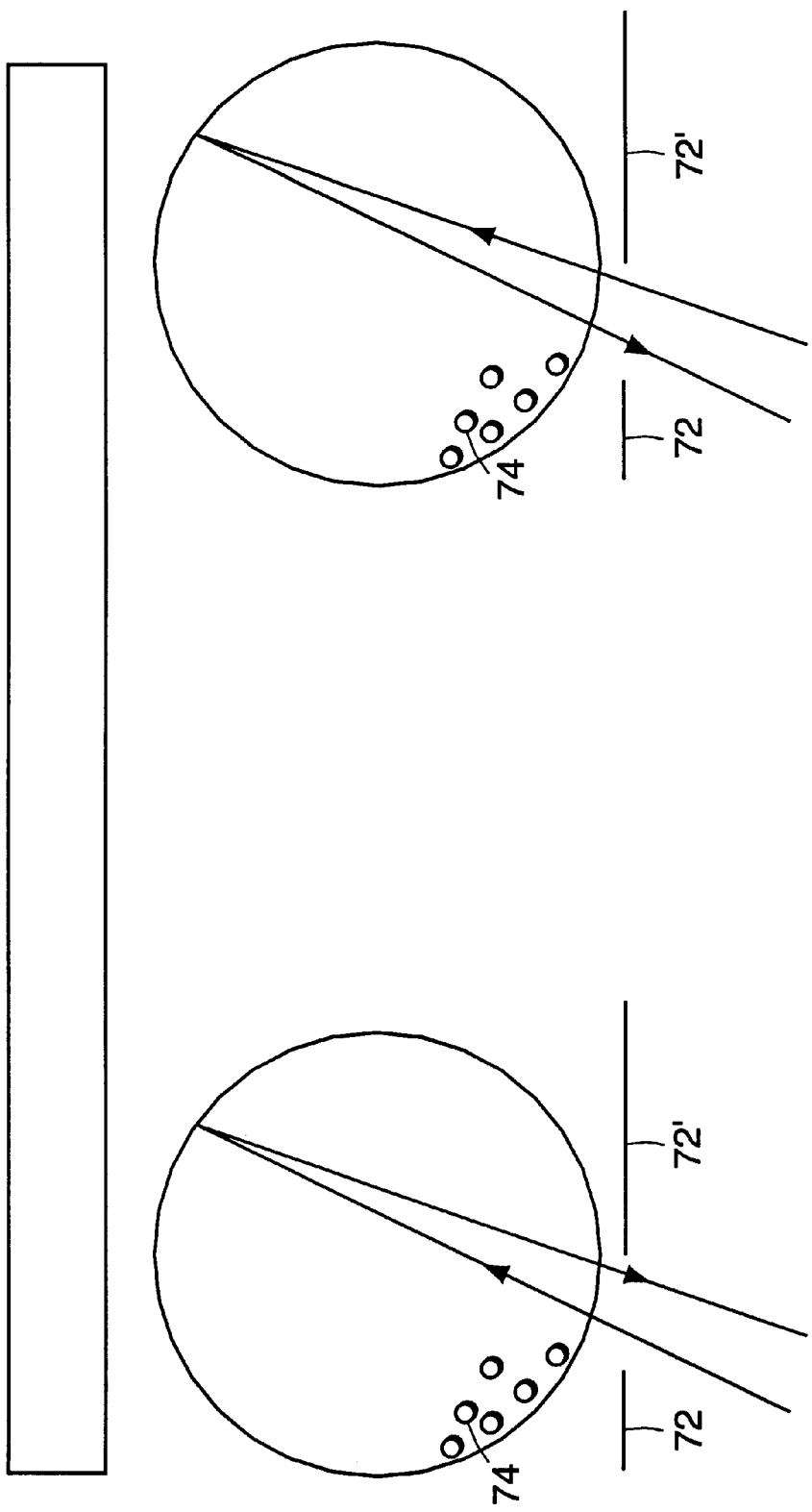
FIG. 12A shows two capsules in a binder disposed adjacent a reflective substrate and two electrodes, in which the particles within the capsule are aligned so as to allow light to pass through the capsule and be reflected by the substrate.
Figure 12B:
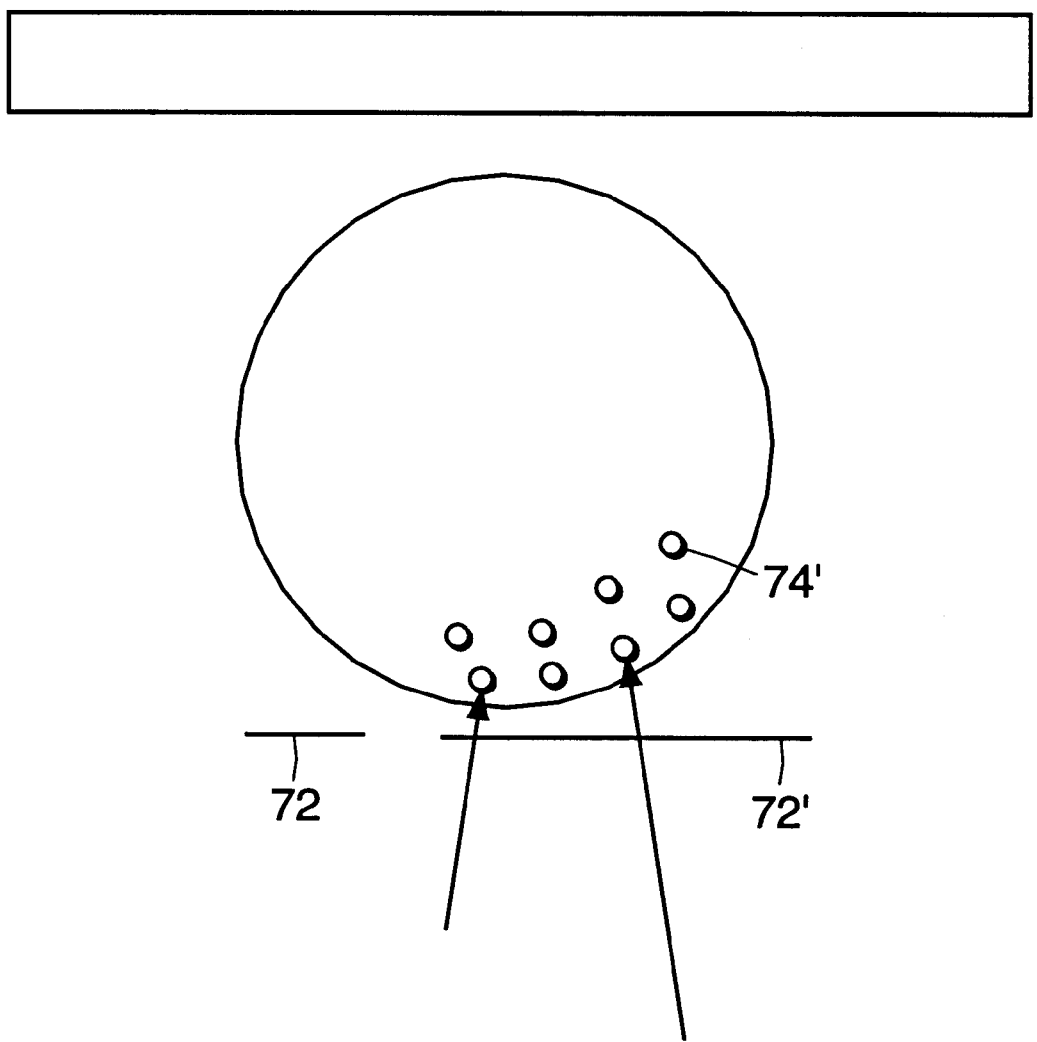
FIG. 12B shows a capsule disposed adjacent a reflective substrate and two electrodes, in which the particles within the capsule are aligned so as to prevent light from passing through the capsule and being reflected by the substrate.

Referring to FIGS. 12A and 12B, a similar structure is described. The electrodes 72 and 72' are, however, different in size (e.g., by more than a factor of 2). The particles are moved to mask either electrode by changing the electric field polarity. In one case (FIG. 12A), the particles cover a small area, and the pixel is largely reflective. In the other case (FIG. 12B), the particles 74' cover a large area, and the pixel is largely absorbing. The materials may be reversed, for example reflective particles and an absorbing backing. There may be a mask which covers one of the electrode locations on the material.

This method of addressing a display includes writing with an electrostatic head either permanently mounted in a fixture or hand held. It may also be applied to an encapsulated magnetophoretic material. It may also be applied to a polymer stabilized liquid crystal technology, or a bistable liquid crystal material of any type, for example, nematic on a photoaligned layer. It may also be applied to a suspended particle display.

Referring again to both FIGS. 11 and 12, in either embodiment, the rear electrode may also be provided as a transmissive, translucent, or otherwise transparent backing, instead of reflective. In these embodiments, a DC field may cause dark (absorbing) particles to cover one electrode, as described above, and the pixel is largely transmissive. These embodiments allow the display to be used to "shutter" light. For example, a display including the described capsules may be addressed so that all of the pixels present in the display are largely transparent, in which case the display would act as a window or clear device. Alternatively, if a fraction of the capsules are addressed, the display is partially transmissive. If all of the capsules are addressed using an AC field, the display is either opaque or reflective.

II. Materials for use in Electrophoretic Displays

Useful materials for constructing the above-described encapsulated electrophoretic displays are discussed below. Many of these materials will be known to those skilled in the art of constructing conventional electrophoretic displays, or those skilled in the art of microencapsulation. The combination of these materials and processes, along with the other necessary components found in an encapsulated electrophoretic display, comprise the invention described herein.

A. Particles

There is much flexibility in the choice of particles for use in electrophoretic displays, as described above. For purposes of this invention, a particle is any component that is charged or capable of acquiring a charge (ie., has or is capable of acquiring electrophoretic mobility), and, in some cases, this mobility may be zero or close to zero (i.e., the particles will not move). The particles may be neat pigments, dyed (laked) pigments or pigment/polymer composites, or any other component that is charged or capable of acquiring a charge. Typical considerations for the electrophoretic particle are its optical properties, electrical properties, and surface chemistry. The particles may be organic or inorganic compounds, and they may either absorb light or scatter light. The particles for use in the invention may further include scattering pigments, absorbing pigments and luminescent particles. The particles may be retroreflective, such as corner cubes, or they may be electroluminescent, such as zinc sulfide particles, which emit light when excited by an AC field, or they may be photoluminescent. Finally, the particles may be surface treated so as to improve charging or interaction with a charging agent, or to improve dispersibility.

A preferred particle for use in electrophoretic displays of the invention is titania. The titania particles may be coated with a metal oxide, such as aluminum oxide or silicon oxide, for example. The titania particles may have one, two, or more layers of metal-oxide coating. For example, a titania particle for use in electrophoretic displays of the invention may have a coating of aluminum oxide and a coating of silicon oxide. The coatings may be added to the particle in any order.

The electrophoretic particle is usually a pigment, a polymer, a laked pigment, or some combination of the above. A neat pigment can be any pigment, and, usually for a light colored particle, pigments such as, for example, rutile (titania), anatase (titania), barium sulfate, kaolin, or zinc oxide are useful. Some typical particles have high refractive indicies, high scattering coefficients, and low absorption coefficients. Other particles are absorptive, such as carbon black or colored pigments used in paints and inks. The pigment should also be insoluble in the suspending fluid. Yellow pigments such as diarylide yellow, hansa yellow, and benzidin yellow have also found use in similar displays. Any other reflective material can be employed for a light colored particle, including non-pigment materials, such as metallic particles.

Useful neat pigments include, but are not limited to, $PbCrO_4$, Cyan blue GT 55-3295 (American Cyanamid Company, Wayne, N.J.), Cibacron Black BG (Ciba Company, Inc., Newport, Del.), Cibacron Turquoise Blue G (Ciba), Cibalon Black BGL (Ciba), Orasol Black BRG (Ciba), Orasol Black RBL (Ciba), Acetamine Blac, CBS (E.I. du Pont de nuemours and Company, Wilmington, Del.), Crocein Scarlet N Ex (E.I. du Pont de Nuemours and Company) (27290), Fiber Black VF (E.I. du Pont de Nuemours and Company) (30235), Luxol Fast Black L (E.I. du Pont de Nuemours and Company) (Solv. Black 17), Nirosine Base No. 424 (E.I. du Pont de Nuemours and Company) (50415 B), Oil Black BG (duPont) (Solv. Black 16), Rotalin Black RM (duPont), Sevron Brilliant Red 3 B (E.I. du Pont de Nuemours and Company); Basic Black DSC (Dye Specialties, Inc.), Hectolene Black (Dye Specialties, Inc.), Azosol Brilliant Blue B (GAF, Dyestuff and Chemical Division, Wayne, N.J.) (Solv. Blue 9), Azosol Brilliant Green BA (GAF) (Solv. Green 2), Azosol Fast Brilliant Red B (GAF), Azosol Fast Orange RA Conc. (GAF) (Solv. Orange 20), Azosol Fast Yellow GRA Conc. (GAF) (13900 A), Basic Black KMPA (GAF), Benzofix Black CW-CF (GAF) (35435), Cellitazol BNFV Ex Soluble CF (GAF) (Disp. Black 9), Celliton Fast Blue AF Ex Conc (GAF) (Disp. Blue 9), Cyper Black IA (GAF) (Basic Blk. 3), Diamine Black CAP Ex Conc (GAF) (30235), Diamond Black EAN Hi Con. CF (GAF) (15710), Diamond Black PBBA Ex (GAF) (16505); Direct Deep Black EA Ex CF (GAF) (30235), Hansa Yellow G (GAF) (11680); Indanthrene Black BBK Powd. (GAF) (59850), Indocarbon CLGS Conc. CF (GAF) (53295), Katigen Deep Black NND Hi Conc. CF (GAF) (15711), Rapidogen Black 3 G (GAF) (Azoic Blk. 4); Sulphone Cyanine Black BA-CF (GAF) (26370), Zambezi Black VD Ex Conc. (GAF) (30015); Rubanox Red CP-1495 (The Sherwin-Williams Company, Cleveland, Ohio) (15630); Raven 11 (Columbian Carbon Company, Atlanta, Ga.), (carbon black aggregates with a particle size of about 25 $\mu$m), Statex B-12 (Columbian Carbon Co.) (a furnace black of 33 $\mu$m average particle size), and chrome green.

Particles may also include laked, or dyed, pigments. Laked pigments are particles that have a dye precipitated on them or which are stained. Lakes are metal salts of readily soluble anionic dyes. These are dyes of azo, triphenylmethane or anthraquinone structure containing one or more sulphonic or carboxylic acid groupings. They are usually precipitated by a calcium, barium or aluminium salt onto a substrate. Typical examples are peacock blue lake (CI Pigment Blue 24) and Persian orange (lake of CI Acid Orange 7), Black M Toner (GAF) (a mixture of carbon black and black dye precipitated on a lake).

A dark particle of the dyed type may be constructed from any light absorbing material, such as carbon black, or inorganic black materials. The dark material may also be selectively absorbing. For example, a dark green pigment may be used. Black particles may also be formed by staining latices with metal oxides, such latex copolymers consisting of any of butadiene, styrene, isoprene, methacrylic acid, methyl methacrylate, acrylonitrile, vinyl chloride, acrylic acid, sodium styrene sulfonate, vinyl acetate, chlorostyrene, dimethylaminopropylmethacrylamide, isocyanoethyl methacrylate and N-(isobutoxymethacrylamide), and optionally including conjugated diene compounds such as diacrylate, triacrylate, dimethylacrylate and trimethacrylate. Black particles may also be formed by a dispersion polymerization technique.

In the systems containing pigments and polymers, the pigments and polymers may form multiple domains within the electrophoretic particle, or be aggregates of smaller pigment/polymer combined particles. Alternatively, a central pigment core may be surrounded by a polymer shell. The pigment, polymer, or both can contain a dye. The optical purpose of the particle may be to scatter light, absorb light, or both. Useful sizes may range from 1 nm up to about 100 $\mu$m, as long as the particles are smaller than the bounding capsule. The density of the electrophoretic particle may be substantially matched to that of the suspending (i.e., electrophoretic) fluid. As defined herein, a suspending fluid has a density that is "substantially matched" to the density of the particle if the difference in their respective densities is between about zero and about two 0.5 g/ml. This difference is preferably between about zero and about 0.5 g/ml.

Useful polymers for the particles include, but are not limited to: polystyrene, polyethylene, polypropylene, phenolic resins, E.I. du Pont de Nuemours and Company Elvax resins (ethylene-vinyl acetate copolymers), polyesters, polyacrylates, polymethacrylates, ethylene acrylic acid or methacrylic acid copolymers (Nucrel Resins E.I. du Pont de Nuemours and Company, Primacor Resins-Dow Chemical), acrylic copolymers and terpolymers (Elvacite Resins, E.I. du Pont de Nuemours and Company) and PMMA. Useful materials for homopolymer/pigment phase separation in high shear melt include, but are not limited to, polyethylene, polypropylene, polymethylmethacrylate, polyisobutylmethacrylate, polystyrene, polybutadiene, polyisoprene, polyisobutylene, polylauryl methacrylate, polystearyl methacrylate, polyisobornyl methacrylate, poly-t-butyl methacrylate, polyethyl methacrylate, polymethyl acrylate, polyethyl acrylate, polyacrylonitrile, and copolymers of two or more of these materials. Some useful pigment/polymer complexes that are commercially available include, but are not limited to, Process Magenta PM 1776 (Magruder Color Company, Inc., Elizabeth, N.J.), Methyl Violet PMA VM6223 (Magruder Color Company, Inc., Elizabeth, N.J.), and Naphthol FGR RF6257 (Magruder Color Company, Inc., Elizabeth, N.J.).

The pigment-polymer composite may be formed by a physical process, (e.g., attrition or ball milling), a chemical process (e.g., microencapsulation or dispersion polymerization), or any other process known in the art of particle production. From the following non-limiting examples, it may be seen that the processes and materials for both the fabrication of particles and the charging thereof are generally derived from the art of liquid toner, or liquid immersion development. Thus any of the known processes from liquid development are particularly, but not exclusively, relevant.

New and useful electrophoretic particles may still be discovered, but a number of particles already known to those skilled in the art of electrophoretic displays and liquid toners can also prove useful. In general, the polymer requirements for liquid toners and encapsulated electrophoretic inks are similar, in that the pigment or dye must be easily incorporated therein, either by a physical, chemical, or physicochemical process, may aid in the colloidal stability, and may contain charging sites or may be able to incorporate materials which contain charging sites. One general requirement from the liquid toner industry that is not shared by encapsulated electrophoretic inks is that the toner must be capable of "fixing" the image, i.e., heat fusing together to create a uniform film after the deposition of the toner particles.

Typical manufacturing techniques for particles are drawn from the liquid toner and other arts and include ball milling, attrition, jet milling, etc. The process will be illustrated for the case of a pigmented polymeric particle. In such a case the pigment is compounded in the polymer, usually in some kind of high shear mechanism such as a screw extruder. The composite material is then (wet or dry) ground to a starting size of around 10 μm. It is then dispersed in a carrier liquid, for example ISOPAR® (Exxon, Houston, Tex.), optionally with some charge control agent(s), and milled under high shear for several hours down to a final particle size and/or size distribution.

Another manufacturing technique for particles drawn from the liquid toner field is to add the polymer, pigment, and suspending fluid to a media mill. The mill is started and simultaneously heated to temperature at which the polymer swells substantially with the solvent. This temperature is typically near 100° C. In this state, the pigment is easily encapsulated into the swollen polymer. After a suitable time, typically a few hours, the mill is gradually cooled back to ambient temperature while stirring. The milling may be continued for some time to achieve a small enough particle size, typically a few microns in diameter. The charging agents may be added at this time. Optionally, more suspending fluid may be added.

Chemical processes such as dispersion polymerization, mini- or micro-emulsion polymerization, suspension polymerization precipitation, phase separation, solvent evaporation, in situ polymerization, seeded emulsion polymerization, or any process which falls under the general category of microencapsulation may be used. A typical process of this type is a phase separation process wherein a dissolved polymeric material is precipitated out of solution onto a dispersed pigment surface through solvent dilution, evaporation, or a thermal change. Other processes include chemical means for staining polymeric latices, for example with metal oxides or dyes.

B. Suspending Fluid The suspending fluid containing the particles can be chosen based on properties such as density, refractive index, and solubility. A preferred suspending fluid has a low dielectric constant (about 2), high volume resistivity (about 10^15 ohm-cm), low viscosity (less than 5 cst), low toxicity and environmental impact, low water solubility (less than 10 ppm), high specific gravity (greater than 1.5), a high boiling point (greater than 90° C.), and a low refractive index (less than 1.2).

The choice of suspending fluid may be based on concerns of chemical inertness, density matching to the electrophoretic particle, or chemical compatibility with both the electrophoretic particle and bounding capsule. The viscosity of the fluid should be low when you want the particles to move. The refractive index of the suspending fluid may also be substantially matched to that of the particles. As used herein, the refractive index of a suspending fluid "is substantially matched" to that of a particle if the difference between their respective refractive indices is between about zero and about 0.3, and is preferably between about 0.05 and about 0.2.

Additionally, the fluid may be chosen to be a poor solvent for some polymers, which is advantageous for use in the fabrication of microparticles because it increases the range of polymeric materials useful in fabricating particles of polymers and pigments. Organic solvents, such as halogenated organic solvents, saturated linear or branched hydrocarbons, silicone oils, and low molecular weight halogen-containing polymers are some useful suspending fluids. The suspending fluid may comprise a single fluid. The fluid will, however, often be a blend of more than one fluid in order to tune its chemical and physical properties. Furthermore, the fluid may contain surface modifiers to modify the surface energy or charge of the electrophoretic particle or bounding capsule. Reactants or solvents for the microencapsulation process (oil soluble monomers, for example) can also be contained in the suspending fluid. Charge control agents can also be added to the suspending fluid.

Useful organic solvents include, but are not limited to, epoxides, such as, for example, decane epoxide and dodecane epoxide; vinyl ethers, such as, for example, cyclohexyl vinyl ether and Decave® (International Flavors & Fragrances, Inc., New York, N.Y.); and aromatic hydrocarbons, such as, for example, toluene and naphthalene. Useful halogenated organic solvents include, but are not limited to, tetrafluorodibromoethylene, tetrachloroethylene, trifluorochloroethylene, 1,2,4-trichlorobenzene, carbon tetrachloride. These materials have high densities. Useful hydrocarbons include, but are not limited to, dodecane, tetradecane, the aliphatic hydrocarbons in the Isopar® series (Exxon, Houston, Tex.), Norpar® (series of normal paraffinic liquids)® Shell-Sol® (Shell, Houston, Tex.), and Sol-Trol® (Shell), naphtha, and other petroleum solvents. These materials usually have low densities. Useful examples of silicone oils include, but are not limited to, octamethyl cyclosiloxane and higher molecular weight cyclic siloxanes, poly (methyl phenyl siloxane), hexamethyldisiloxane, and polydimethylsiloxane. These materials usually have low densities. Useful low molecular weight halogen-containing polymers include, but are not limited to, poly(chlorotrifluoroethylene) polymer (Halogenated hydrocarbon Inc., River Edge, N.J.), Galden® (a perfluorinated ether from Ausimont, Morristown, N.J.), or Krytox® from E.I. du Pont de Nuemours and Company (Wilmington, Del.). In a preferred embodiment, the suspending fluid is a poly(chlorotrifluoroethylene) polymer. In a particularly preferred embodiment, this polymer has a degree of polymerization from about 2 to about 10. Many of the above materials are available in a range of viscosities, densities, and boiling points.

The fluid must be capable of being formed into small droplets prior to a capsule being formed. Processes for forming small droplets include flow-through jets, membranes, nozzles, or orifices, as well as shear-based emulsifying schemes. The formation of small drops may be assisted by electrical or sonic fields. Surfactants and polymers can be used to aid in the stabilization and emulsification of the droplets in the case of an emulsion type encapsulation. A preferred surfactant for use in displays of the invention is sodium dodecylsulfate.

It can be advantageous in some displays for the suspending fluid to contain an optically absorbing dye. This dye must be soluble in the fluid, but will generally be insoluble in the other components of the capsule. There is much flexibility in the choice of dye material. The dye can be a pure compound, or blends of dyes to achieve a particular color, including black. The dyes can be fluorescent, which would produce a display in which the fluorescence properties depend on the position of the particles. The dyes can be photoactive, changing to another color or becoming colorless upon irradiation with either visible or ultraviolet light, providing another means for obtaining an optical response. Dyes could also be polymerizable, forming a solid absorbing polymer inside the bounding shell.

There are many dyes that can be chosen for use in encapsulated electrophoretic display. Properties important here include light fastness, solubility in the suspending liquid, color, and cost. These are generally from the class of azo, anthraquinone, and triphenylmethane type dyes and may be chemically modified so as to increase the solubility in the oil phase and reduce the adsorption by the particle surface.

A number of dyes already known to those skilled in the art of electrophoretic displays will prove useful. Useful azo dyes include, but are not limited to: the Oil Red dyes, and the Sudan Red and Sudan Black series of dyes. Useful anthraquinone dyes include, but are not limited to: the Oil Blue dyes, and the Macrolex Blue series of dyes. Useful triphenylmethane dyes include, but are not limited to, Michler's hydrol, Malachite Green, Crystal Violet, and Auramine O.

C. Charge Control Agents and Particle Stabilizers

Charge control agents are used to provide good electrophoretic mobility to the electrophoretic particles. Stabilizers are used to prevent agglomeration of the electrophoretic particles, as well as prevent the electrophoretic particles from irreversibly depositing onto the capsule wall. Either component can be constructed from materials across a wide range of molecular weights (low molecular weight, oligomeric, or polymeric), and may be pure or a mixture. In particular, suitable charge control agents are generally adapted from the liquid toner art. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

An optional charge control agent or charge director may be used. These constituents typically consist of low molecular weight surfactants, polymeric agents, or blends of one or more components and serve to stabilize or otherwise modify the sign and/or magnitude of the charge on the electrophoretic particles. The charging properties of the pigment itself may be accounted for by taking into account the acidic or basic surface properties of the pigment, or the charging sites may take place on the carrier resin surface (if present), or a combination of the two. Additional pigment properties which may be relevant are the particle size distribution, the chemical composition, and the lightfastness. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

Charge adjuvants may also be added. These materials increase the effectiveness of the charge control agents or charge directors. The charge adjuvants may be a polyhydroxy compound or an aminoalcohol compound, which are preferably soluble in the suspending fluid in an amount of at least 2% by weight. Examples of polyhydroxy compounds which contain at least two hydroxyl groups include, but are not limited to, ethylene glycol, 2,4,7,9-tetramethyl decyne 4,7-diol, poly (propylene glycol), pentaethylene glycol, tripropylene glycol, triethylene glycol, glycerol, pentaerythritol, glyceroltris (12 hydroxystearate, propylene glycerol monohydroxystearate, and ethylene glycol monohydroxystearate. Examples of aminoalcohol compounds which contain at least one alcohol function and one amine function in the same molecule include, but are not limited to, triisopropanolamine, triethanolamine, ethanolarnine, 3-amino-1-propanol, o-aminophenol, 5-amino-1-pentanol, and tetrakis(2-hydroxyethyl)ethylene-diamine. The charge adjuvant is preferably present in the suspending fluid in an amount of about 1to about 100 mg/g of the particle mass, and more preferably about 50 to about 200 mg/g.

The surface of the particle may also be chemically modified to aid dispersion, to improve surface charge, and to improve the stability of the dispersion, for example. Surface modifiers include organic siloxanes, organohalogen silanes and other functional silane coupling agents (Dow Corning® Z-6070, Z-6124, and 3 additive, Midland, Mich.); organic titanates and zirconates (Tyzor® TOT, TBT, and TE Series, E.I. du Pont de Nuemours and Company, Wilmington, Del.); hydrophobing agents, such as long chain (C12 to C50) alkyl and alkyl benzene sulphonic acids, fatty amines or diamines and their salts or quartemary derivatives; and amphipathic polymers which can be covalently bonded to the particle surface.

In general, it is believed that charging results as an acid-base reaction between some moiety present in the continuous phase and the particle surface. Thus useful materials are those which are capable of participating in such a reaction, or any other charging reaction as known in the art.

Different non-limiting classes of charge control agents which are useful include organic sulfates or sulfonates, metal soaps, block or comb copolymers, organic amides, organic zwitterions, and organic phosphates and phosphonates. Useful organic sulfates and sulfonates include, but are not limited to, sodium bis(2-ethylhexyl) sodium sulfosuccinate, calcium dodecyl benzene sulfonate, calcium petroleum sulfonate, neutral or basic barium dinonylnaphthalene sulfonate, neutral or basic calcium dinonylnaphthalene sulfonate, dodecylbenzenesulfonic acid sodium salt, and ammonium lauryl sulphate. Useful metal soaps include, but are not limited to, basic or neutral barium petronate, calcium petronate, Co-, Ca-, Cu-, Mn-, Ni-, Zn-, and Fe- salts of naphthenic acid, Ba-, Al-, Zn-, Cu-, Pb-, and Fe- salts of stearic acid, divalent and trivalent metal carboxylates, such as aluminum tristearate, aluminum octanote, lithium heptanoate, iron stearate, iron distearate, barium stearate, chromium stearate, magnesium octoate, calcium stearate, iron naphthenate, and zinc naphthenate, Mn- and Zn-heptanoate, and Ba-, Al-, Co-, Mn-, and Zn- Octoate. Useful block or comb copolymers include, but are not limited to, AB diblock copolymers of (A) polymers of 2-(N,N) dimethylaminoethyl methacrylate quaternized with methyl-p-toluenesulfonate and (B) poly-2-ethylhexyl methacrylate, and comb graft copolymers with oil soluble tails of poly (12-hydroxystearic acid) and having a molecular weight of about 1800, pendant on an oil-soluble anchor group of poly (methyl methacrylatemethacrylic acid). Useful organic amides include, but are not limited to, polyisobutylene succinimides such as OLOA 1200, and N-vinyl pyrrolidone polymers. Useful organic zwitterions include, but are not limited to, lecithin. Useful organic phosphates and phosphonates include, but are not limited to, the sodium salts of phosphated mono- and di-glycerides with saturated and unsaturated acid substituents.

Particle dispersion stabilizers may be added to prevent particle flocculation or attachment to the capsule walls. For the typical high resistivity liquids used as suspending fluids in electrophoretic displays, nonaqueous surfactants may be used. These include, but are not limited to, glycol ethers, acetylenic glycols, alkanolamides, sorbitol derivatives, alkyl amines, quaternary amines, imidazolines, dialkyl oxides, and sulfosuccinates.

D. Encapulation

There is a long and rich history to encapsulation, with numerous processes and polymers having proven useful in creating capsules. Encapsulation of the internal phase may be accomplished in a number of different ways. Numerous suitable procedures for microencapsulation are detailed in both *Microencapsulation, Processes and Applications*, (I.E. Vandegaer, ed.), Plenum Press, New York, N.Y. (1974) and Gutcho, *Microcapsules and Mircroencapsulation Techniques*, Nuyes Data Corp., Park Ridge, N.J. (1976), both of which are hereby incorporated by reference herein. The processes fall into several general categories, all of which can be applied to the present invention: interfacial polymerization, in situ polymerization, physical processes, such as coextrusion and other phase separation processes, in-liquid curing, and simple/complex coacervation.

Numerous materials and processes should prove useful in formulating displays of the present invention. Useful materials for simple coacervation processes include, but are not limited to, gelatin, polyvinyl alcohol, polyvinyl acetate, and cellulosic derivatives, such as, for example, carboxymethylcellulose. Useful materials for complex coacervation processes include, but are not limited to, gelatin, acacia, carageenan, carboxymethylcellulose, hydrolized styrene anhydride copolymers, agar, alginate, casein, albumin, methyl vinyl ether co-maleic anhydride, and cellulose phthalate. Useful materials for phase separation processes include, but are not limited to, polystyrene, PMMA, polyethyl methacrylate, polybutyl methacrylate, ethyl cellulose, polyvinyl pyridine, and poly acrylonitrile. Useful materials for in situ polymerization processes include, but are not limited to, polyhydroxyamides, with aldehydes, melamine, or urea and formaldehyde; water-soluble oligomers of the condensate of melamine, or urea and formaldehyde; and vinyl monomers, such as, for example, styrene, MMA and acrylonitrile. Finally, useful materials for interfacial polymerization processes include, but are not limited to, diacyl chlorides, such as, for example, sebacoyl, adipoyl, and di- or poly-amines or alcohols, and isocyanates. Useful emulsion polymerization materials may include, but are not limited to, styrene, vinyl acetate, acrylic acid, butyl acrylate, t-butyl acrylate, methyl methacrylate, and butyl methacrylate.

Capsules produced may be dispersed into a curable carrier, resulting in an ink which may be printed or coated on large and arbitrarily shaped or curved surfaces using conventional printing and coating techniques.

In the context of the present invention, one skilled in the art will select an encapsulation procedure and wall material based on the desired capsule properties. These properties include the distribution of capsule radii; electrical, mechanical, diffusion, and optical properties of the capsule wall; and chemical compatibility with the internal phase of the capsule.

The capsule wall generally has a high electrical resistivity. Although it is possible to use walls with relatively low resistivities, this may limit performance in requiring relatively higher addressing voltages. A full discussion of the relevant electrical properties of the capsule wall is set forth in U.S. Pat. No. 4,605,284, the entire disclosure of which is hereby incorporated by reference herein. The capsule wall should also be mechanically strong (although if the finished capsule powder is to be dispersed in a curable polymeric binder for coating, mechanical strength is not as critical). The capsule wall should generally not be porous. If, however, it is desired to use an encapsulation procedure that produces porous capsules, these can be overcoated in a post-processing step (i.e., a second encapsulation). Moreover, if the capsules are to be dispersed in a curable binder, the binder will serve to close the pores. The capsule walls should be optically clear. The wall material may, however, be chosen to match the refractive index of the internal phase of the capsule (i.e., the suspending fluid) or a binder in which the capsules are to be dispersed. For some applications (e.g., interposition between two fixed electrodes), monodispersed capsule radii are desirable.

An encapsulation technique that is highly suited to the present invention is set forth in U.S. Pat. No. 4,087,376, the entire disclosure of which is hereby incorporated by reference herein. The procedure involves a polymerization between urea and formaldehyde in an aqueous phase of an oil/water emulsion in the presence of a negatively charged, carboxyl-substituted, linear hydrocarbon polyelectrolyte material. The resulting capsule wall is a urea/formaldehyde copolymer, which discretely encloses the internal phase. The capsule is clear, mechanically strong, and has good resistivity properties.

The related technique of in situ polymerization utilizes an oil/water emulsion, which is formed by dispersing the electrophoretic composition (i.e., the dielectric liquid containing a suspension of the pigment particles) in an aqueous environment. The monomers polymerize to form a polymer with higher affinity for the internal phase than for the aqueous phase, thus condensing around the emulsified oily droplets. In one especially useful in situ polymerization processes, urea and formaldehyde condense in the presence of poly (acrylic acid) (See, e.g., U.S. Pat. No. 4,001,140). In other useful process, described in U.S. Pat. No. 4,273,672, any of a variety of cross-linking agents borne in aqueous solution is deposited around microscopic oil droplets. Such cross-linking agents include aldehydes, especially formaldehyde, glyoxal, or glutaraldehyde; alum; zirconium salts; and poly isocyanates. The entire disclosures of the U.S. Pat. No. 4,001,140 and U.S. Pat. No. 4,273,672 patents are hereby incorporated by reference herein.

The coacervation approach also utilizes an oil/water emulsion. One or more colloids are coacervated (i.e., agglomerated) out of the aqueous phase and deposited as shells around the oily droplets through control of temperature, pH and/or relative concentrations, thereby creating the microcapsule. Materials suitable for coacervation include gelatins and gum arabic. See, e.g., U.S. Pat. No. 2,800,457, the entire disclosure of which is hereby incorporated by reference herein.

The interfacial polymerization approach relies on the presence of an oil-soluble monomer in the electrophoretic composition, which once again is present as an emulsion in an aqueous phase. The monomers in the minute hydrophobic droplets react with a monomer introduced into the aqueous phase, polymerizing at the interface between the droplets and the surrounding aqueous medium and forming shells around the droplets. Although the resulting walls are relatively thin and may be permeable, this process does not require the elevated temperatures characteristic of some other processes, and therefore affords greater flexibility in terms of choosing the dielectric liquid.

Figure 13A:
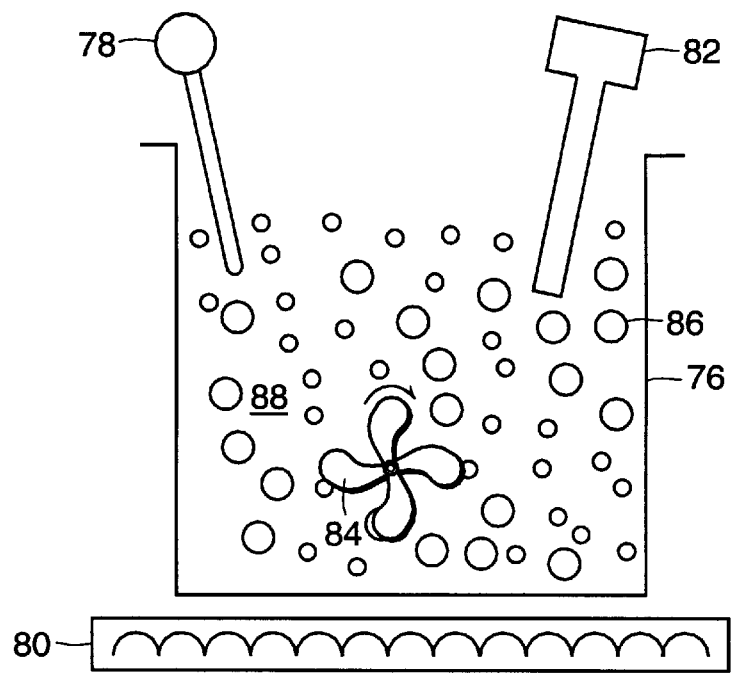
FIG. 13A is an illustration of an apparatus for performing emulsion-based encapsulation.

FIG. 13A illustrates an exemplary apparatus and environment for performing emulsion-based encapsulation. An oil/water emulsion, is prepared in a vessel 76 equipped with a device 78 for monitoring and a device 80 for controlling the temperature. A pH monitor 82 may also be included. An impeller 84 maintains agitation throughout the encapsulation process, and in combination with emulsifiers, can be used to control the size of the emulsion droplets 86 that will lead to the finished capsules. The aqueous continuous phase 88 may contain, for example, a prepolymer and various system modifiers.

Figure 13B:
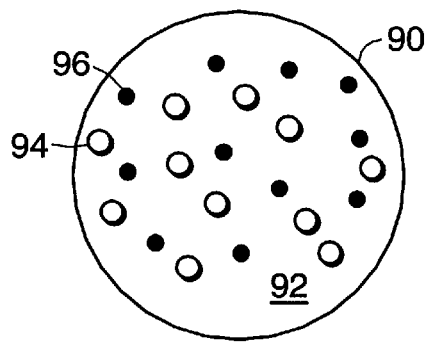
FIG. 13B is an illustration of an oil drop of suspending fluid having white and black particles dispersed within it.

FIG. 13B illustrates an oil drop 90 comprising a substantially transparent suspending fluid 92, in which is dispersed white microparticles 94 and black particles 96. Preferably, particles 94 and 96 have densities substantially matched to the density of suspending fluid 92. The liquid phase may also contain some threshold/bistability modifiers, charge control agents, and/or hydrophobic monomers to effect an interfacial polymerization.

Figure 13C:
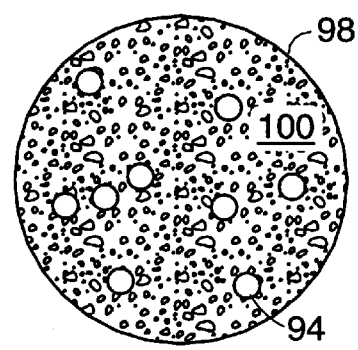
FIG. 13C is an illustration of an oil drop of darkly dyed suspending fluid having white microparticles and charge control agents dispersed within it.

FIG. 13C illustrates a similar oil drop 98 comprising a darkly dyed suspending fluid 100 containing a dispersion of white particles 94 and appropriate charge control agents.

Coating aids can be used to improve the uniformity and quality of the coated or printed electrophoretic ink material. Wetting agents are typically added to adjust the interfacial tension at the coating/substrate interface and to adjust the liquid/air surface tension. Wetting agents include, but are not limited to, anionic and cationic surfactants, and nonionic species, such as silicone or fluoropolymer based materials. Dispersing agents may be used to modify the interfacial tension between the capsules and binder, providing control over flocculation and particle settling.

Surface tension modifiers can be added to adjust the air/ink interfacial tension. Polysiloxanes are typically used in such an application to improve surface levelling while minimizing other defects within the coating. Surface tension modifiers include, but are not limited to, fluorinated surfactants, such as, for example, the Zonyl® series from E.I. du Pont de Nuemours and Company (Wilmington, Del.), the Fluorod® series from 3M (St. Paul, Minn.), and the fluoroakyl series from Autochem (Glen Rock, N.J.); siloxanes, such as, for example, Silwet® from Union Carbide (Danbury, Conn.); and polyethoxy and polypropoxy alcohols. Antifoams, such as silicone and silicone-free polymeric materials, may be added to enhance the movement of air from within the ink to the surface and to facilitate the rupture of bubbles at the coating surface. Other useful antifoams include, but are not limited to, glyceryl esters, polyhydric alcohols, compounded antifoams, such as oil solutions of alkyl benzenes, natural fats, fatty acids, and metallic soaps, and silicone antifoaming agents made from the combination of dimethyl siloxane polymers and silica. Stabilizers such as uv-absorbers and antioxidants may also be added to improve the lifetime of the ink.

Other additives to control properties like coating viscosity and foaming can also be used in the coating fluid. Stabilizers (UV-absorbers, antioxidants) and other additives which could prove useful in practical materials.

E. Binder Material

The binder is used as a non-conducting, adhesive medium supporting and protecting the capsules, as well as binding the electrode materials to the capsule dispersion. Binders are available in many forms and chemical types. Among these are water-soluble polymers, water-borne polymers, oil-soluble polymers, thermoset and thermoplastic polymers, and radiation-cured polymers.

Among the water-soluble polymers are the various polysaccharides, the polyvinyl alcohols, N-methylpyrolidone, N-vinylpyrolidone, the various Carbowax® species (Union Carbide, Danbury, Conn.), and poly-2-hydroxyethylacrylate.

The water-dispersed or water-borne systems are generally latex compositions, typified by the Neorez® and Neocryl® resins (Zeneca Resins, Wilmington, Mass.), Acrysol® (Rohm and Haas, Philadelphia, Pa.), Bayhydrol® (Bayer, Pittsburgh, Pa.), and the Cytec Industries (West Paterson, N.J.) HP line. These are generally latices of polyurethanes, occasionally compounded with one or more of the acrylics, polyesters, polycarbonates or silicones, each lending the final cured resin in a specific set of properties defined by glass transition temperature, degree of "tack," softness, clarity, flexibility, water permeability and solvent resistance, elongation modulus and tensile strength, thermoplastic flow, and solids level. Some water-borne systems can be mixed with reactive monomers and catalyzed to form more complex resins. Some can be further cross-linked by the use of a crosslinking reagent, such as an aziridine, for example, which reacts with carboxyl groups.

A typical application of a water-borne resin and aqueous capsules follows. A volume of particles is centrifuged at low speed to separate excess water. After a given centrifugation process, for example 10 minutes at 60×G, the capsules are found at the bottom of the centrifuge tube, while the water portion is at the top. The water portion is carefully removed (by decanting or pipetting). The mass of the remaining capsules is measured, and a mass of resin is added such that the mass of resin is between one eighth and one tenth of the weight of the capsules. This mixture is gently mixed on an oscillating mixer for approximately one half hour. After about one half hour, the mixture is ready to be coated onto the appropriate substrate.

The thermoset systems are exemplified by the family of epoxies. These binary systems can vary greatly in viscosity, and the reactivity of the pair determines the "pot life" of the mixture. If the pot life is long enough to allow a coating operation, capsules may be coated in an ordered arrangement in a coating process prior to the resin curing and hardening.

Thermoplastic polymers, which are often polyesters, are molten at high temperatures. A typical application of this type of product is hot-melt glue. A dispersion of heat-resistant capsules could be coated in such a medium. The solidification process begins during cooling, and the final hardness, clarity and flexibility are affected by the branching and molecular weight of the polymer.

Oil or solvent-soluble polymers are often similar in composition to the waterborne system, with the obvious exception of the water itself. The latitude in formulation for solvent systems is enormous, limited only by solvent choices and polymer solubility. Of considerable concern in solvent-based systems is the viability of the capsule itself—the integrity of the capsule wall cannot be compromised in any way by the solvent.

Radiation cure resins are generally found among the solvent-based systems. Capsules may be dispersed in such a medium and coated, and the resin may then be cured by a timed exposure to a threshold level of ultraviolet radiation, either long or short wavelength. As in all cases of curing polymer resins, final properties are determined by the branching and molecular weights of the monomers, oligomers and crosslinkers.

A number of "water-reducible" monomers and oligomers are, however, marketed. In the strictest sense, they are not water soluble, but water is an acceptable diluent at low concentrations and can be dispersed relatively easily in the mixture. Under these circumstances, water is used to reduce the viscosity (initially from thousands to hundreds of thousands centipoise). Water-based capsules, such as those made from a protein or polysaccharide material, for example, could be dispersed in such a medium and coated, provided the viscosity could be sufficiently lowered. Curing in such systems is generally by ultraviolet radiation.

III. EXAMPLES

Example 1

The following procedure describes gelatin/acacia microencapsulation for use in electrophoretic displays of the present invention.

A Preparation of Oil (Internal) Phase

To a 1L flask is added 0.5 g of Oil Blue N (Aldrich, Milwaukee, Wis.), 0.5 g of Sudan Red 7B (Aldrich), 417.25 g of Halogenated hydrocarbon Oil 0.8 (Halogenated hydrocarbon Products Corp., River Edge, N.J.), and 73.67 g of Isopar-G® (Exxon, Houston, Tex.). The mixture is stirred at 60° C. for six hours and is then cooled to room temperature. 50.13 g of the resulting solution is placed in a 50 mL polypropylene centrifuge tube, to which is added 1.8 g of titanium dioxide ($TiO_2$) (E.I. du Pont de Nuemours and Company, Wilmington, Del), 0.78 g of a 10% solution of OLOA 1200 (Chevron, Somerset, N.J.), in Halogenated hydrocarbon Oil 0.8, and 0.15 g of Span 85 (Aldrich). This mixture is then sonicated for five minutes at power 9 in an Aquasonic Model 75D sonicator (VWR, Westchester, Pa.) at 30° C.

B. Preparation of Aqueous Phase 10.0 g of acacia (Aldrich) is dissolved in 100.0 g of water with stirring at room temperature for 30 minutes. The resulting mixture is decanted into two 50 mL polypropylene centrifuge tubes and centrifuged at about 2000 rpm for 10 minutes to remove insoluble material. 66 g of the purified solution is then decanted into a 500 mL non-baffled jacketed reactor, and the solution is then heated to 40° C. A six-blade (vertical geometry) paddle agitator is then placed just beneath the surface of the liquid. While agitating the solution at 200 rpm, 6 g of gelatin (300 bloom, type A, Aldrich) is carefully added over about 20 seconds in order to avoid lumps. Agitation is then reduced to 50 rpm to reduce foaming. The resulting solution is then stirred for 30 minutes.

C. Encapsulation

With agitation at 200 rpm, the oil phase, prepared as described above, is slowly poured over about 15 seconds into the aqueous phase, also prepared as described above. The resulting oil/water emulsion is allowed to emulsify for 20 minutes. To this emulsion is slowly added over about 20 seconds 200 g of water that has been preheated to 40° C. The pH is then reduced to 4.4 over five minutes with a 10% acetic acid solution (acetic acid from Aldrich). The pH is monitored using a pH meter that was previously calibrated with pH 7.0 and pH 4.0 buffer solutions. Stir for 40 minutes. 150 g of water that has been preheated to 40° C. is then added, and the contents of the reactor are then cooled to 10° C. When the solution temperature reaches 10° C., 3.0 mL of a 37% formalin solution (Aldrich) is added, and the solution is further stirred for another 60 minutes. 20 g of sodium carboxymethylcellulose (NaCMC) is added, and the pH is then raised to 10.0 by the addition of a 20 wt % solution of sodium hydroxide (NaOH). The thermostat bath is then set to 40° C. and allowed to stir for another 70 minutes. The slurry is allowed to cool to room temperature overnight with stirring. The resulting capsule slurry is then ready to be sieved.

D. Formation of Display

Two procedures for preparing an electrophoretic display are from the above capsule slurry are described below.

1. Procedure Using a Urethane Binder

The resulting capsule slurry from above is mixed with the aqueous urethane binder NeoRez R-9320 (Zeneca Resins, Wilmington, Mass.) at a ratio of one part binder to 10 parts capsules. The resulting mixture is then coated using a doctor blade onto a 0.7 mm thick sheet of indium-tin oxide sputtered polyester film. The blade gap of the doctor blade is controlled at 0.18 mm so as to lay down a single layer of capsules. The coated film is then dried in hot air (60° C.) for 30 minutes. After drying, the dried film is hot laminated at 60° C. to a backplane comprising a 3 mm thick sheet of polyester screen printed with thick film silver and dielectric inks with a pressure of 15 psi in a hot roll laminate from Cheminstruments, Fairfield, Ohio. The backplane is connected to the film using an anisotropic tape. The conductive areas form addressable areas of the resulting display.

2. Procedure Using a Urethane/polyvinyl Alcohol Binder

The resulting capsule slurry from above is mixed with the aqueous binder comprising a mixture of NeoRez R-966 (Zeneca Resins) and a 20% solution of Airvol 203 (a polyvinyl alcohol, Airvol Industries, Allentown, Pa.) at a ratio of one part Airvol 203 solution to one part NeoRez R-966 to five parts capsules. The resulting mixture is then coated using a doctor blade onto a 0.7 mm thick sheet of indium-tin oxide sputtered polyester film. The blade gap of the doctor blade is controlled to 0.18 mm so as to lay down an single layer of capsules. The coated film is then dried in hot air (60° C.) for 30 minutes. After drying, a thick film silver ink is then printed directly onto the back of the dried film and allowed to cure at 60° C. The conductive areas form the addressable areas of the display.

Example 2

The following is an example of the preparation of microcapsules by in situ polymerization.

In a 500 mL non-baffled jacketed reactor is mixed 50 mL of a 10 wt % aqueous solution of ethylene co-maleic anhydride (Aldrich), 100 mL water, 0.5 g resorcinol (Aldrich), and 5.0 g urea (Aldrich). The mixture is stirred at 200 rpm and the pH adjusted to 3.5 with a 25 wt % NaOH solution over a period of 1 minute. The pH is monitored using a pH meter that was previously calibrated with pH 7.0 and pH 4.0 buffer solutions. To this is slowly added the oil phase, prepared as described above in Ex. 1, and agitation is increased to 450 rpm to reduce the average particle size to less than 200 $\mu$m. 12.5 g of a 37 wt % aqueous formaldehyde solution is then added and the temperature raised to 55° C. The solution is heated at 55° C. for two hours.

Example 3

The following is an example of the preparation of microcapsules by interfacial polymerization.

To 44 g of the oil phase, prepared as described above in Ex. 1, is added 1.0 g of sebacoyl chloride (Aldrich). Three milliliters of the mixture is then dispersed in 200 mL of water with stirring at 300 rpm at room temperature. To this dispersion is then added 2.5 mL of a 10 wt.% aqueous solution of 1,6-diaminohexane. Capsules form after about one hour.

Encapsulated electrophoretic displays and materials useful in constructing them are therefore described. Additional aspects and advantages of the invention are apparent upon consideration of the foregoing. Accordingly, the scope of the invention is limited only by the scope of the appended claims.

What is claimed is:

1. An encapsulated electrophoretic display having a viewed surface and a rear surface, comprising a polymer matrix having fluid-containing cavities, wherein said cavities are non-spherical in shape and an aspect ratio of width to height for said cavities is greater than about 1.2.

2. The display of claim 1, wherein said aspect ratio is greater than about 1.5.

3. The display of claim 2, wherein said aspect ratio is greater than about 1.75.

4. The display of claim 1, wherein said viewed surface is substantially planar.

5. The display of claim 1, wherein both said viewed surface and said rear surface are substantially planar.

6. The display of claim 1, wherein said fluid-containing cavities are elastomeric capsules.

7. The display of claim 1, wherein said fluid comprises an oil.

8. An encapsulated electrophoretic display having a viewed surface and a rear surface, comprising a polymer matrix having fluid-containing cavities, wherein said cavities are non-spherical in shape and a volume fraction of said polymer matrix is between about 0.0 to about 0.9.

9. The display of claim 8, wherein said volume fraction is between about 0.05 to about 0.2.

10. The display of claim 8, wherein said viewed surface is substantially planar.

11. The display of claim 8, wherein both said viewed surface and said rear surface are substantially planar.

12. The display of claim 8, wherein said fluid-containing cavities are elastomeric capsules.

13. The display of claim 8, wherein said fluid comprises an oil.

14. An encapsulated electrophoretic display having a viewed surface and a rear surface, comprising a polymer matrix having fluid-containing cavities, wherein said cavities are non-spherical in shape and have an optically active fraction of said viewed surface is greater than about 80%.

15. The display of claim 14, wherein said optically active fraction is greater than about 90%.

16. The display of claim 14, wherein said fluid-containing cavities are elastomeric capsules.

17. The display of claim 14, wherein said fluid comprises an oil.

18. The display of claim 14, wherein said viewed surface is substantially planar.

19. The display of claim 14, wherein both said viewed surface and said rear surface are substantially planar.

* * * * *

UNITED STATES PATENT AND TRADEMARK OFFICE
CERTIFICATE OF CORRECTION

PATENT NO. : 6,392,785 B1
DATED : May 21, 2002
INVENTOR(S) : Jonathan D. Albert and Barrett Comiskey It is certified that error appears in the above-identified patent and that said Letters Patent is hereby corrected as shown below:

Column 26,
Line 14, should read as follows:

14. An encapsulated electrophoretic display having a viewed surface and a rear surface, comprising a polymer matrix having fluid-containing cavities, wherein said cavities are non-spherical in shape and a optically active fraction of said viewed surface is greater than about 80%.

Signed and Sealed this

Eleventh Day of March, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,392,785 B1  
DATED : May 21, 2002  
INVENTOR(S) : Jonathan D. Albert and Barrett Comiskey It is certified that error appears in the above-identified patent and that said Letters Patent is hereby corrected as shown below:

<u>Column 26,</u>  
Lines 19-23, should read as follows:

14. An encapsulated electrophoretic display having a viewed surface and a rear surface, comprising a polymer matrix having fluid-containing cavities, wherein said cavities are non-spherical in shape and an optically active fraction of said viewed surface is greater than about 80%.

This certificate supersedes Certificate of Correction issued March 11, 2003.

Signed and Sealed this

First Day of July, 2003

JAMES E. ROGAN  
*Director of the United States Patent and Trademark Office*